US008599576B2

(12) United States Patent
Faxvog et al.

(10) Patent No.: US 8,599,576 B2
(45) Date of Patent: Dec. 3, 2013

(54) ELECTROMAGNETICALLY-PROTECTED ELECTRONIC EQUIPMENT

(75) Inventors: Frederick R. Faxvog, Long Lake, MN (US); Greg Fuchs, River Falls, WI (US); Wallace Jensen, Centerville, MN (US); David Blake Jackson, Excelsior, MN (US); Bill Volna, St Anthony Village, MN (US); Gale Nordling, Excelsior, MN (US); James Nicholas Ruehl, Excelsior, MN (US)

(73) Assignee: Emprimus, LLC, St. Louis Park, MN (US)

( * ) Notice: Subject to any disclaimer, the term of this patent is extended or adjusted under 35 U.S.C. 154(b) by 213 days.

(21) Appl. No.: 13/285,581

(22) Filed: Oct. 31, 2011

(65) Prior Publication Data
US 2012/0140431 A1 Jun. 7, 2012

Related U.S. Application Data

(60) Provisional application No. 61/408,340, filed on Oct. 29, 2010, provisional application No. 61/408,424, filed on Oct. 29, 2010, provisional application No. 61/425,143, filed on Dec. 20, 2010.

(51) Int. Cl.
*H05K 9/00* (2006.01)

(52) U.S. Cl.
USPC ........... 361/818; 361/816; 361/800; 361/730; 361/809; 361/753; 174/50; 174/520; 174/559; 174/560

(58) Field of Classification Search
USPC ......... 361/730, 752, 753, 800, 799, 809, 816, 361/818; 174/50, 520, 559, 560
See application file for complete search history.

(56) References Cited

U.S. PATENT DOCUMENTS 3,009,984 A 11/1961 Lindgren
3,075,818 A 1/1963 Fay
(Continued)

FOREIGN PATENT DOCUMENTS

EP 0 668 692 A1 8/1995
EP 1 114 423 B1 2/2007
(Continued)

OTHER PUBLICATIONS

Military Handbook 235-1B, Electromagnetic (Radiated) Environment Considerations for Design and Procurement of Electrical and Electronic Equipment, Subsystems and Systems, Part 1B, General Guidance, 20 Pages, 1993.
(Continued)

*Primary Examiner* — Hoa C Nguyen
*Assistant Examiner* — Robert Brown
(74) *Attorney, Agent, or Firm* — Merchant & Gould P.C.

(57) ABSTRACT

Equipment and systems for protecting electronics against damage or upsets from electromagnetic pulse (HEMP or EMP), intentional electromagnetic interference (IEMI), and high power RF weapons are disclosed. This equipment can include a shielding arrangement includes a metallic enclosure having an interior volume defining a protected portion and an unprotected portion separated by an electromagnetically shielding barrier, and having a portal providing access to the protective portion and including an access opening, a shielding cover sized to cover the access opening, and an electromagnetically sealing gasket positioned around a perimeter of the access opening. The shielding arrangement also includes one or more filters positioned at least partially within the unprotected portion and along the electromagnetically shielding barrier to dampen electromagnetic signals and/or power signals outside a predetermined acceptable range. In some cases, waveguides beyond cutoff are included, to provide passage of optical signals or airflow through the enclosure.

19 Claims, 16 Drawing Sheets

(56) References Cited

U.S. PATENT DOCUMENTS

| | | |
|---|---|---|
| 3,158,016 A | 11/1964 | Fay |
| 3,189,394 A | 6/1965 | Fay |
| 3,231,663 A | 1/1966 | Schwartz |
| 3,297,383 A | 1/1967 | Fay |
| 3,962,550 A | 6/1976 | Kaiserswerth |
| D245,303 S | 8/1977 | Gazarek |
| 4,060,709 A | 11/1977 | Hanson |
| 4,066,305 A | 1/1978 | Gazarek |
| D248,003 S | 5/1978 | Gazarek |
| 4,102,554 A | 7/1978 | Reimer |
| 4,115,656 A | 9/1978 | Aitel |
| 4,177,353 A | 12/1979 | McCormack |
| 4,655,012 A | 4/1987 | Downey et al. |
| 4,660,014 A | 4/1987 | Wenaas et al. |
| 4,677,251 A | 6/1987 | Merewether |
| 4,691,483 A | 9/1987 | Anderson |
| 4,748,790 A | 6/1988 | Frangolacci |
| 4,755,630 A | 7/1988 | Smith et al. |
| H526 H | 9/1988 | Miller |
| 4,787,181 A | 11/1988 | Witten et al. |
| D300,097 S | 3/1989 | Cook |
| 4,884,171 A | 11/1989 | Maserang et al. |
| 4,894,489 A | 1/1990 | Takahashi et al. |
| 4,913,476 A | 4/1990 | Cook |
| 5,045,636 A | 9/1991 | Johnasen et al. |
| 5,079,388 A | 1/1992 | Balsells |
| 5,117,066 A | 5/1992 | Balsells |
| 5,136,453 A | 8/1992 | Oliver |
| 5,148,111 A | 9/1992 | Shiloh et al. |
| 5,179,489 A | 1/1993 | Oliver |
| 5,184,311 A | 2/1993 | Kraus et al. |
| 5,190,479 A | 3/1993 | Jordi |
| 5,191,544 A | 3/1993 | Benck et al. |
| 5,241,132 A | 8/1993 | McCormack |
| 5,436,786 A | 7/1995 | Pelly et al. |
| 5,465,534 A | 11/1995 | Mittag |
| 5,594,200 A | 1/1997 | Ramsey |
| 5,600,290 A | 2/1997 | Anderson, II |
| 5,685,358 A | 11/1997 | Kawasaki et al. |
| 5,751,530 A | 5/1998 | Pelly et al. |
| 5,828,220 A | 10/1998 | Carney et al. |
| 5,983,578 A | 11/1999 | Huttie et al. |
| 6,090,728 A | 7/2000 | Yenni, Jr. et al. |
| 6,157,546 A * | 12/2000 | Petty et al. .................... 361/816 |
| 6,185,065 B1 | 2/2001 | Hasegawa et al. |
| 6,210,787 B1 | 4/2001 | Goto et al. |
| 6,292,373 B1 | 9/2001 | Li et al. |
| 6,320,123 B1 | 11/2001 | Reimers |
| 6,324,075 B1 * | 11/2001 | Unrein et al. .................. 361/816 |
| 6,346,330 B1 | 2/2002 | Huang et al. |
| 6,377,473 B1 * | 4/2002 | Huang et al. .................. 361/816 |
| 6,380,482 B1 | 4/2002 | Norte et al. |
| 6,426,459 B1 | 7/2002 | Mitchell |
| 6,442,046 B1 * | 8/2002 | Sauer ............................ 361/818 |
| 6,485,595 B1 | 11/2002 | Yenni, Jr. et al. |
| 6,542,380 B1 * | 4/2003 | Hailey et al. .................. 361/799 |
| 6,542,384 B1 * | 4/2003 | Radu et al. .................... 361/818 |
| 6,613,979 B1 | 9/2003 | Miller et al. |
| 6,683,245 B1 * | 1/2004 | Ogawa et al. .................. 174/382 |
| 6,838,613 B2 | 1/2005 | Kopf |
| 6,870,092 B2 | 3/2005 | Lambert et al. |
| 6,872,971 B2 | 3/2005 | Hutchinson et al. |
| 6,891,478 B2 | 5/2005 | Gardner |
| 7,071,631 B2 | 7/2006 | Howard, II |
| 7,210,557 B2 | 5/2007 | Phillips et al. |
| 7,258,574 B2 | 8/2007 | Barringer et al. |
| 7,369,416 B2 * | 5/2008 | Plabst ........................... 361/818 |
| 7,418,802 B2 | 9/2008 | Sarine et al. |
| 7,420,742 B2 | 9/2008 | Wood et al. |
| 7,475,624 B1 | 1/2009 | Daily |
| 7,498,524 B2 * | 3/2009 | Brench ......................... 174/354 |
| 7,504,590 B2 | 3/2009 | Ball |
| 7,512,430 B2 | 3/2009 | Nakamura |
| 7,515,219 B2 | 4/2009 | Bozzer et al. |
| 7,560,135 B2 | 7/2009 | Kotsubo et al. |
| 7,561,444 B2 * | 7/2009 | He ................................. 361/818 |
| 7,576,289 B2 | 8/2009 | Kessel |
| 7,589,943 B2 | 9/2009 | Ramirez et al. |
| 7,710,708 B2 | 5/2010 | Park et al. |
| 7,839,020 B2 | 11/2010 | Nakanishi |
| 8,085,554 B2 * | 12/2011 | Holdredge et al. ........... 361/818 |
| 8,351,221 B2 * | 1/2013 | Siomkos et al. .............. 361/818 |
| 8,358,512 B2 * | 1/2013 | Shiroishi et al. .............. 361/799 |
| 8,358,515 B2 * | 1/2013 | Chen et al. .................... 361/816 |
| 8,373,998 B2 * | 2/2013 | Ricci et al. .................... 361/800 |
| 8,406,012 B2 * | 3/2013 | Kim ............................... 361/816 |
| 2001/0046128 A1 * | 11/2001 | Ogata ............................ 361/800 |
| 2003/0024172 A1 | 2/2003 | Lyons et al. |
| 2003/0174487 A1 * | 9/2003 | Garmong ...................... 361/816 |
| 2004/0112205 A1 | 6/2004 | MacDougall |
| 2004/0232847 A1 | 11/2004 | Howard, II |
| 2005/0174749 A1 * | 8/2005 | Liikamaa et al. ............. 361/799 |
| 2006/0272857 A1 * | 12/2006 | Arnold .......................... 174/377 |
| 2006/0274517 A1 * | 12/2006 | Coffy ............................ 361/816 |
| 2007/0002547 A1 | 1/2007 | Garmong |
| 2007/0025095 A1 * | 2/2007 | Beall et al. .................... 361/796 |
| 2007/0105445 A1 | 5/2007 | Manto et al. |
| 2007/0126871 A1 | 6/2007 | Henninger, III et al. |
| 2007/0127129 A1 | 6/2007 | Wood et al. |
| 2007/0158914 A1 | 7/2007 | Tammaro et al. |
| 2008/0050172 A1 | 2/2008 | Simola et al. |
| 2008/0080158 A1 * | 4/2008 | Crocker et al. ............... 361/818 |
| 2008/0250726 A1 | 10/2008 | Slagel et al. |
| 2009/0067141 A1 * | 3/2009 | Dabov et al. .................. 361/753 |
| 2009/0125316 A1 * | 5/2009 | Moore ........................... 705/1 |
| 2009/0140499 A1 * | 6/2009 | Kline ............................. 277/645 |
| 2009/0229194 A1 | 9/2009 | Armillas |
| 2009/0244876 A1 * | 10/2009 | Li et al. ......................... 361/818 |
| 2009/0268420 A1 * | 10/2009 | Long ............................. 361/800 |
| 2009/0278729 A1 | 11/2009 | Bosser et al. |
| 2009/0291608 A1 | 11/2009 | Choi et al. |
| 2010/0103628 A1 * | 4/2010 | Steffler ......................... 361/730 |
| 2010/0116542 A1 | 5/2010 | Sugihara et al. |
| 2010/0128455 A1 | 5/2010 | Ophoven et al. |
| 2010/0208433 A1 | 8/2010 | Heimann et al. |
| 2010/0315792 A1 * | 12/2010 | Jones ............................ 361/753 |
| 2011/0088940 A1 | 4/2011 | Nordling et al. |
| 2011/0222249 A1 | 9/2011 | Ruehl et al. |
| 2011/0267765 A1 | 11/2011 | Fuchs et al. |
| 2013/0170159 A1 * | 7/2013 | Jiang ............................. 361/753 |

FOREIGN PATENT DOCUMENTS

| | | |
|---|---|---|
| GB | 294513 | 7/1928 |
| JP | 11-239288 | 8/1999 |

OTHER PUBLICATIONS

Military Handbook 237B, Department of Defense Handbook, Guidance for Controlling Electromagnetic Environmental Effects on Platforms, Systems, and Equipment, 248 Pages, 1997.

Military Handbook 253, Guidance for the Design and Test of Systems Protected Against the Effects of Electromagnetic Energy, 27 Pages, 1978.

Military Handbook 273, Survivability Enhancement, Aircraft, Nuclear Weapon Threat, Design and Evaluation Guidelines, 228 Pages, 1983.

Military Handbook 411B, Power and the Environment for Sensitive DoD Electronic Equipment (General), vol. 1, 658 Pages, 1990.

Military Handbook 419A, Grounding, Bonding, and Shielding for Electronic Equipments and Facilities, vol. 1 of 2 Volumes, Basic Theory, 812 Pages, 1987.

Military Handbook 1857, Grounding, Bonding and Shielding Design Practices, 185 Pages, 1998.

Military Handbook 5961A, List of Standard Semiconductor Devices, 33 Pages, 1999.

Military Standard 188-124B, Grounding, Bonding and Shielding, for Common Long Haul/Tactical Communication Systems Including Ground Based Communications-Electronics Facilities and Equipments, 41 Pages, 1992.

Military Standard 188-125-1, Department of Defense Interface Standard, High-Altitude Electromagnetic Pulse (HEMP) Protection for

(56) References Cited

OTHER PUBLICATIONS

Ground-Based C41 Facilities Performing Critical, Time-Urgent Missions (Part 1—Fixed Facilities), 107 Pages, 1998.
Military Standard 188-125-2, Department of Defense Interface Standard, High-Altitude Electromagnetic Pulse (HEMP) Protection for Ground-Based C41 Facilities Performing Critical, Time-Urgent Missions (Part 2—Transportable Systems), 148 Pages, 1999.
Military Standard 188-125, High-Altitude Electromagnetic Pulse (HEMP) Protection for Ground-Based C41 Facilities Performing Critical, Time-Urgent Missions (vol. 1—Fixed Facilities), 114 Pages, Feb. 1994.
Military Standard 220C, Department of Defense—Test Method Standard—Method of Insertion Loss Measurement, 19 Pages, 2009.
Military Standard 285—Notice of Cancellation—MIL-STD-285, dated 1956 canceled, 17 Pages, 1997.
Military Standard 285, Military Standard Attenuation Measurements for Enclosures, Electromagnetic Shielding, for Electronic Test Purposes, 15 Pages, 1956.
Military Standard 461C, Electromagnetic Emission and Susceptibility Requirements for the Control of Electromagnetic Interference, 183 Pages, 1986.
Military Standard 461E, Requirements for the Control of Electromagnetic Interference Characteristics of Subsystems and Equipment, 253 Pages, 1999.
Military Standard 461F, Requirements for the Control of Electromagnetic Interference Characteristics of Subsystems and Equipment, 269 Pages, 2007.
Military Standard 462, Electromagnetic Interference Characteristics, 80 Pages, 1967.
Military Standard 462D, Measurement of Electromagnetic Interference Characteristics, 203 Pages, 1993.
Military Standard 464, Electromagnetic Environmental Effects Requirements for Systems, 116 Pages, 1997.
Military Standard 464A, Electromagnetic Environmental Effects Requirements for Systems, 121 Pages, 2002.
Military Standard 469B, Radar Engineering Interface Requirements, Electromagnetic Compatibility, 98 Pages, 1996.
Military Standard 1542B (USAF), Electromagnetic Compatibility and Grounding Requirements for Space System Facilities, 52 Pages, 1991.
Military Handbook 1195, Radio Frequency Shielded Enclosures, 86 Pages, Sep. 1988.
IEEE Std 299-1997, IEEE Standard Method for Measuring the Effectiveness of Electromagnetic Shielding Enclosures, 44 Pages, 1997.
Leland H. Hemming, Architectural Electromagnetic Shielding Handbook—A Design Specification Guide, IEEE Press, 232 Pages, 1991.
USAF Handbook for the Design and Construction of HEMP/TEMPEST Shielded Facilities, AF Regional Civil Engineer Central Region, Dallas, Texas, 39 Pages, 1986.
ETS-Lindgren—High Performance EMI/RFI Shielding Solutions, 2 Pages, 2002.
ETS-Lindgren—Double Electrically Isolated RF Enclosures, For Industrial, Communication, and Research and Development Applications, 8 Pages, 2005.
ETS-Lindgren—Tempest Information Processing System (TIPS), 2 Pages, 2008.
ETS-Lindgren—Table Top Enclosure—5240 Series, 2 Pages, 2009.
ETS-Lindgren—Auto Latching Door System, 2 Pages, (undated).
ETS-Lindgren—RF Shielded Doors, 5 Pages, (undated).
NSA-94-106, National Security Agency Specification for Shielded Enclosures, 9 Pages, 1994.
Holland Shielding Systems BV, Shielding Gaskets With or Without Water Seal (EMI-RFI-IP Gaskets), 2 Pages, (undated).
Holland Shielding Systems BV, EMI-RFI-EMP—Shielded Doors for Faraday Cages and EMI-RFI Shielded Room, 5 Pages, (undated).
Holland Shielding Systems BV, Innovative EMI Shielding Solutions—Gasket Selection, 36 Pages, (undated).
Equipto Electronic Corporation—Technical Guide to EMI/RFI Suppression in Electronic Cabinets, 16 Pages, Apr. 2005.
Crenlo-Emcor-Product-Options-Doors, 12 Pages, (undated).
RFI/EMI Shielded Cabinets and Features Available, 4 Pages, (undated).
Special Door Company, Radiation Shielding Doors: SH Door Tech, 2 Pages, (undated).
Special Door Company, EMP Doors: Electro Magnetic Pulse Doors, 3 Pages, (undated).
Braden Shielding Systems, Anechoic Chambers, EMC Chambers, MRI Enclosures, 1 Page, (undated).
Magnetic Shield Corp.—Bensenville, Illinois, Magnetic Shielding, 2 Pages, (undated).
EEP—Electromagnetic Radiation Shielding & Magnetic Field Shielding Technology—Products and Services, 3 Pages, (undated).
Fleming—RF & EMI Shielded Doors, Radiation Shielded Doors, 3 Pages, (undated).
H. Bloks, "NEMP/EMI Shielding," EMC Technology, vol. 5, No. 6, Nov.-Dec. 1986, 5 Pages.
W.E. Curran, "New Techniques in Shielding," ITEM, 1984, 9 Pages.
W. E. Curran, "Shielding for HEMP/TEMPEST Requirements," ITEM, 1988, 10 Pages.

* cited by examiner

ELECTROMAGNETICALLY-PROTECTED ELECTRONIC EQUIPMENT

CROSS REFERENCE TO RELATED APPLICATIONS

The present application claims priority to U.S. Provisional Patent Application No. 61/408,340, filed Oct. 29, 2010, U.S. Provisional Patent Application No. 61/408,424, filed Oct. 29, 2010, and U.S. Provisional Patent Application No. 61/425,143, filed Dec. 20, 2010. The disclosures of each of these applications are hereby incorporated by reference in their entireties.

TECHNICAL FIELD

The present disclosure relates generally to electronic devices. In particular, the present disclosure relates to electromagnetic protection of electronic equipment, such as power utility electronic equipment, supervisory control & data acquisition (SCADA) systems, communications systems, data processing systems or other semiconductor-based systems.

BACKGROUND

Electronic equipment, including equipment based on semiconductor technology, is susceptible to damage or upsets from High Altitude Electromagnetic Pulse (HEMP or EMP), Intentional Electromagnetic Interference (IEMI) and RF interference. For example, stored data in modern electronic data systems, control systems and recording systems can be upset, scrambled or lost by EMP, IEMI or RF energy. At higher energy levels of EMP, IEMI or RF power the semiconductor devices within electronics units can be destroyed.

Damage based on exposure to electromagnetic fields is not limited to semiconductor-based systems. For example, EMP and IEMI events can cause interference or damage to electrical equipment, causing that equipment to malfunction or rendering it nonoperational. Electrical equipment can also be destroyed by strong electromagnetic pulse (EMP), intentional electromagnetic interference (IEMI) or high power RF radiation. The detailed characteristics of EMP radiation are described in Military Standard 188-125, entitled "High Altitude Electromagnetic Pulse Protection for Ground Based C4I Facilities Performing Critical, Time-Urgent Missions". The detailed characteristics of IEMI are described in IEC Standard 61000-2-13, "High-power electromagnetic (HPEM) environments-Radiated and conducted."

In general, EMP/IEMI/RF events typically take one of two forms. First, high field events correspond to short-duration, high electromagnetic field events (e.g., up to and exceeding 100 kilovolts per meter), and typically are of the form of short pulses of narrow-band or distributed signals (e.g., in the frequency range of typically 14 kHz to 10 GHz). These types of events typically generate high voltage differences in equipment, leading to high induced currents and burnout of electrical components. Second, low field events (e.g., events in the range of 0.01 to 10 volts per meter) are indications of changing electromagnetic environments below the high field damaging environments, but still of interest in certain applications.

Existing electromagnetic protection schemes are typically used to protect against a narrow range of threats. The protection schemes built into electronic systems are generally developed to address a certain possible issue, are not useful to address other electromagnetic interference issues. Although attempts have been made to "harden" or protect, certain military systems against these threats, many commercial electronic systems remain unprotected. However, these existing "hardening" solutions are cost-prohibitive to apply to a wide range of electronics, exposing critical assets to possible damage. Additionally, existing solutions provide some amount of shielding, but are not designed to accommodate all of the cooling and access considerations required of many modern electronic systems. Additionally, earlier shielding attempts could at times limit the functionality of electronics included in such systems, since at times power or other signals would be entirely disrupted to avoid damage to internal electronics. Because the vast majority of electronics remain unprotected from EMP/IEMI/RF events, a widespread outage or failure due to electromagnetic interference could have disastrous effects.

For these and other reasons, improvements are desirable.

SUMMARY

In accordance with the following disclosure, the above and other issues are addressed by the following:

In a first aspect, a shielding arrangement for an electronic device is disclosed. The shielding arrangement includes a metallic enclosure having an interior volume defining a protected portion and an unprotected portion separated by an electromagnetically shielding barrier, the metallic enclosure having a portal providing access to at least the protective portion, the portal including an access opening, a shielding cover sized to cover the access opening, and an electromagnetically sealing gasket positioned around a perimeter of the access opening. The shielding arrangement includes an electrical filter positioned at least partially within the unprotected portion and along the electromagnetically shielding barrier and configured to dampen and diminish electromagnetically induced currents and voltages outside a predetermined acceptable range. The shielding arrangement also includes a power filter positioned at least partially within the unprotected portion and along the electromagnetically shielding barrier and configured to receive an unfiltered power signal from external to the metallic enclosure and pass a filtered power signal through the electromagnetically shielding barrier to the protected portion. The shielding arrangement also includes a waveguide beyond cutoff positioned along the barrier and configured to allow optical signals of a predetermined frequency pass from the unprotected portion to the protected portion. The shielding arrangement further includes one or more vents through the metallic enclosure and allowing airflow from external to the enclosure to pass into at least one of the protected portion and the unprotected portion. The vents are each formed of a waveguide beyond cutoff having one or more apertures configured to shield the interior volume from exposure to electromagnetic signals exceeding a predetermined acceptable magnitude and frequency.

In a second aspect, an electromagnetically shielded electronic device includes a metallic enclosure having an interior volume defining a protected portion and an unprotected portion separated by an electromagnetically shielding barrier. The metallic enclosure includes a portal providing access to at least the protective portion, the portal including an access opening, a shielding cover sized to cover the access opening, and an electromagnetically sealing gasket positioned around a perimeter of the access opening. The electromagnetically shielded electronic device includes an electronic device placed within the protected portion of the interior volume, and an electrical filter positioned at least partially within the unprotected portion and along the electromagnetically shielding barrier, the electrical filter communicatively connected along a wired connection to the electronic device and configured to dampen and diminish electromagnetically induced voltages and currents outside a predetermined acceptable range that pass from the unprotected portion to the electronic device along the wired connection. The electromagnetically shielded electronic device also includes a power filter positioned at least partially within the unprotected portion and along the electromagnetically shielding barrier, the power filter configured to receive an unfiltered power signal from external to the metallic enclosure and pass a filtered power signal through the electromagnetically shielding barrier to the electronic device. The electromagnetically shielded electronic device further includes one or more vents through the metallic enclosure and allowing airflow from external to the enclosure to pass into at least one of the protected portion and the unprotected portion, the vents each formed of a waveguide beyond cutoff having one or more apertures configured to shield the interior volume from exposure to electromagnetic signals exceeding a predetermined magnitude and frequency.

In a third aspect, an electromagnetically shielded electronic system includes first and second electromagnetically shielded electronic devices. A first device includes a metallic enclosure having an interior volume, the interior volume defining a protected portion and an unprotected portion separated by an electromagnetically shielding barrier. The metallic enclosure has a portal providing access to at least the protective portion the portal including an access opening, a shielding cover sized to cover the access opening, and an electromagnetically sealing gasket positioned around a perimeter of the access opening. The electromagnetically shielded electronic system further includes an electronic device placed within the protected portion of the interior volume. The first device further includes an electrical filter positioned at least partially within the unprotected portion and along the electromagnetically shielding barrier, the electrical filter communicatively connected along a wired connection between the electronic device and an external electrical connection. The electrical filter is configured to dampen and diminish electromagnetic signals outside a predetermined acceptable range that pass from the unprotected portion to the electronic device along the wired connection. The second device includes a second metallic enclosure having an interior volume, and a second electronic device placed within the interior volume. The second device further includes a second electrical filter positioned at least partially within the second metallic enclosure and communicatively connected along a wired connection between the second electronic device and an external electrical connection, the second electrical filter configured to dampen and diminish electromagnetic signals outside a predetermined acceptable range that pass from external to the second metallic enclosure to the second electronic device along the wired connection. The system further includes a communicative connection between the electronic device and the second electronic device.

DETAILED DESCRIPTION

Figure 1:
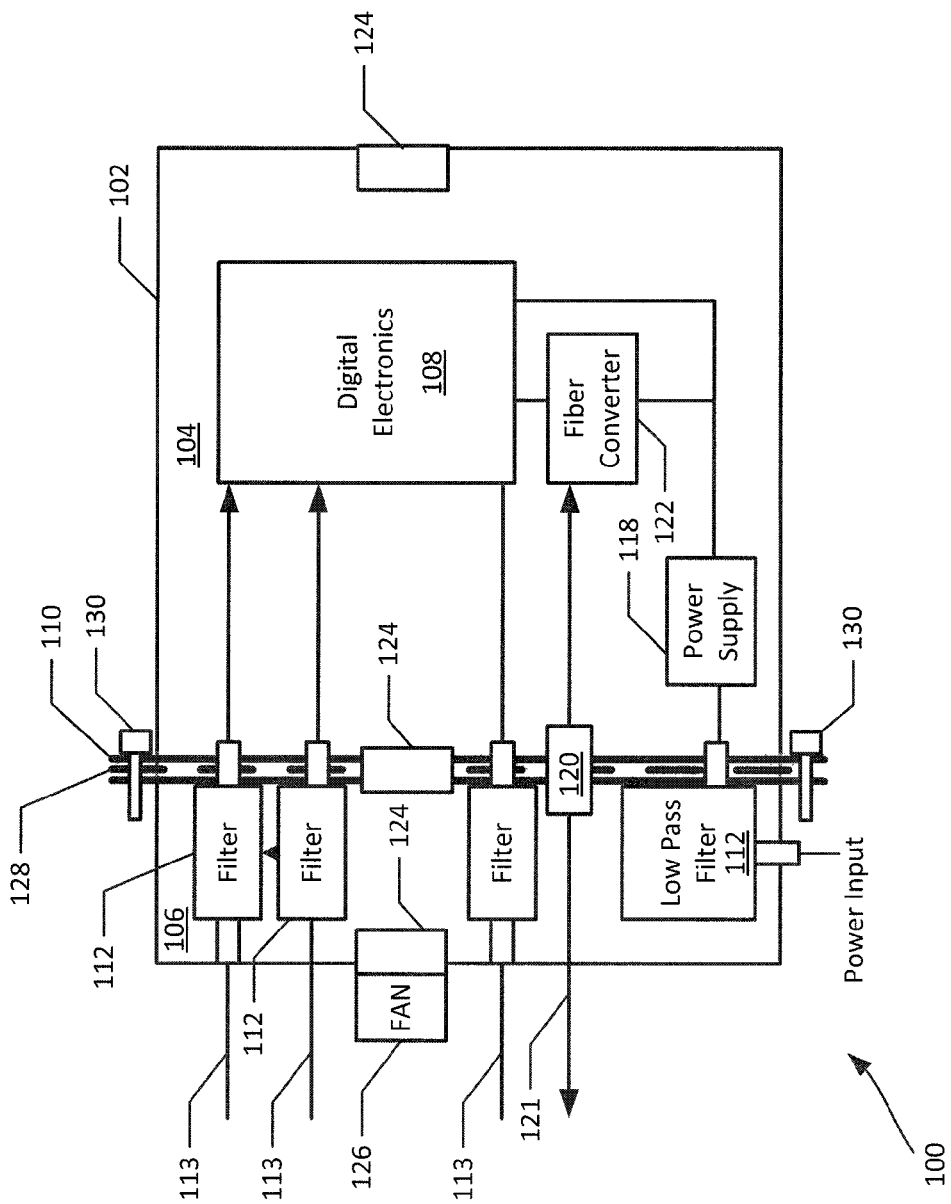
FIG. 1 is a schematic top view of a shielding arrangement including an EMP/IEMI/RF protected enclosure providing protection against both radiated and conducted electromagnetic energy, according to an example embodiment.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general the present disclosure describes, generally, enclosures capable of providing shielding from various types of electromagnetic events capable of damaging electronic equipment. In some of the various embodiments described herein, the enclosures can be, for example, constructed of steel or aluminum that is sealed with welded seams and a conductive gasket for sealing a cover, front panel or other closure surface. The enclosures provide attenuation of radiated electromagnetic energy, such that harmful signals essentially cannot penetrate the enclosure. The enclosures disclosed herein can also, in some embodiments, include electrical filters that provide a path for signals to enter and exit the enclosure, but greatly attenuate the unwanted electromagnetic conducted energy, which typically occurs at higher frequencies. Additionally, in some embodiments the enclosure includes honeycomb waveguide air vents that also provide attenuation of radiated electromagnetic waves/energy, which also reduce unwanted EMP, IEMI and RF energy entering the enclosure, and reduce the risk of damage to electronic equipment within such enclosures in a cost-effective and compact structure, while concurrently meeting management access and airflow management requirements of electronics systems.

In some aspects, embodiments of the present disclosure relate to a low cost and practical method to protect electronic equipment, including SCADA systems, Electrical utility breaker equipment, and communications systems from Electromagnetic Pulse (EMP), Intentional Electromagnetic Interference (IEMI) and RF weapons. Using the systems and methods of the present disclosure, SCADA, electrical utility breaker and communications electronics can be protected from being destroyed or enabled by EMP, IEMI or RF weapons compared to unprotected equipment. According to various embodiments, the electronics are placed in an EMP/IEMI/RF shielded enclosure, and electrical or other communicative interfaces are sealed and filtered to prevent entry into that enclosure of unwanted signals to interfere with the electronic equipment.

In certain embodiments, the systems of the present disclosure can include SCADA controllers (digital and analog electronics), power utility electronics, and communications electronics housed within an EMP and/or IEMI shielded enclosure. Signal filters (housed within one or more containers) to filter out and remove all high frequency, for example greater than typically 14 kHz for EMP and greater than 1 MHz for IEMI, electromagnetic energy.

Figure 2:
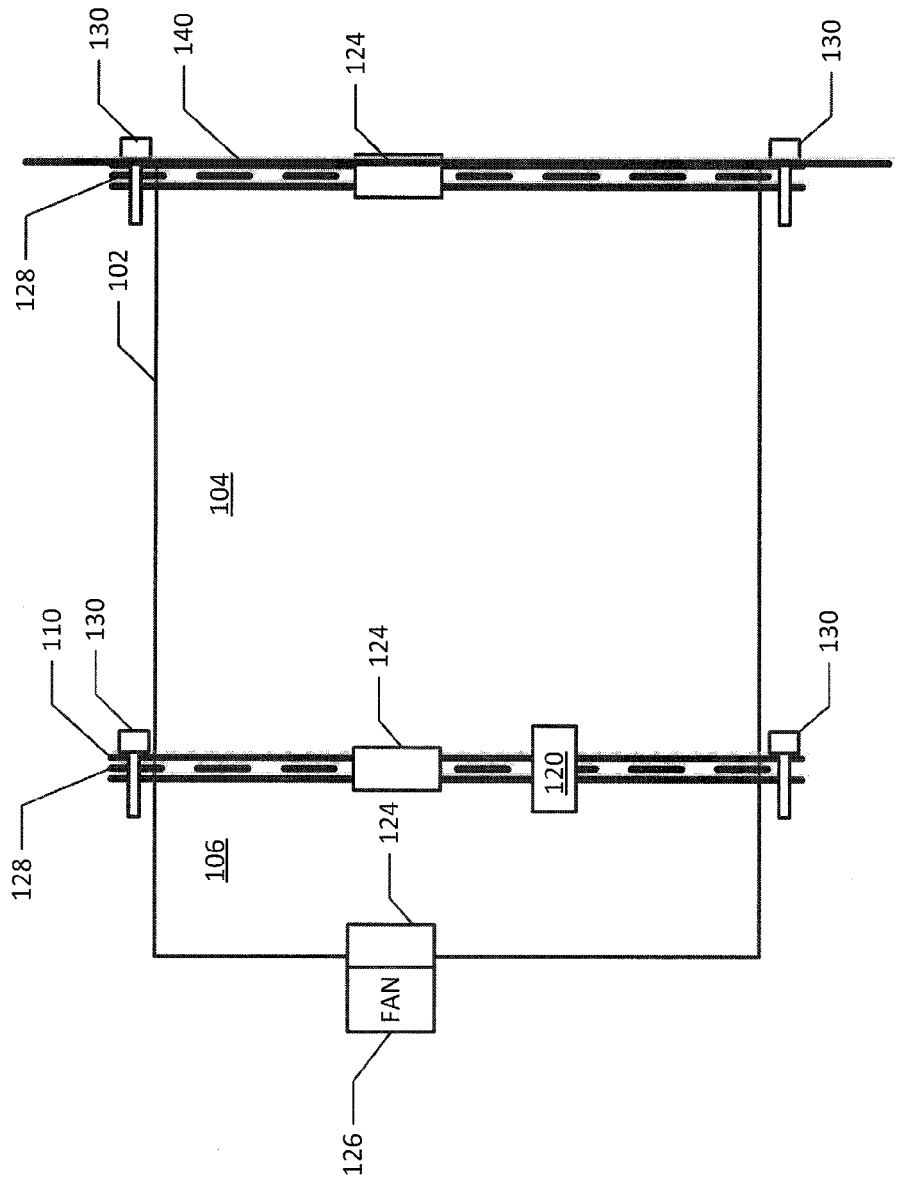
FIG. 2 illustrates an example embodiment of components of the arrangement of FIG. 1.

Referring now to FIGS. 1-2, a shielding arrangement 100 for an electronic device is shown, which provides shielding from potentially damaging EMP/IEMI/RF signals. In the embodiment shown, the enclosure 100 includes a shielded enclosure 102. The shielded enclosure 102 has an interior volume formed from a protected region 104 and an unprotected region 106. The shielded enclosure 102 generally provides attenuation of potentially harmful electromagnetic signals for at least components placed within the protected regions 104. In various embodiments, the shielded enclosure 102 can be constructed from conductive materials, such as a metal (e.g., sheet metal or aluminum) having a thickness generally sufficient to attenuate electromagnetic signals to acceptable levels. In an example embodiment, the shielded enclosure 102 provides about 70 dB or more of attenuation.

Generally, the shielded enclosure contains electronics 108, shown in the example of FIG. 1 to include digital electronics; however, other types of electronics systems, including mixed digital/analog electronics could be used as well. In some example embodiments, the electronics 108 can include digital or analog electronics, fiber to electrical signal converters, and power supplies. The electronics 108 are shielded from the potentially harmful electromagnetic signals, and therefore are placed within the protected region 104. In the context of the present disclosure, the electromagnetic signals that are intended to be shielded are high energy signals, typically having magnitudes and frequencies about typical communication ranges experienced by electronic systems. For example, the short duration, high energy signals provided by EMP/IEMI/RF events are shielded.

In the embodiment shown, the shielded enclosure 102 includes a barrier 110 separating the protected region 104 and the unprotected region 106. The barrier 110 can be constructed from similar materials as the rest of the enclosure, and generally provides attenuation for any electromagnetic signals in the unprotected region 106 to prevent their ingress into the protected region 104.

In accordance with the present disclosure, it is recognized that electronics maintained within the protected region 104 will generally require power and/or communicative connections. Accordingly, in the embodiment shown, a plurality of filters are positioned at least partially within the unprotected region 106, and configured to filter out signals outside of an expected frequency or magnitude range. The unprotected portion 106 houses the various signal or Ethernet signal filters for signal inputs and outputs from the enclosure, as necessary based on the type of electronics included in the overall arrangement 100. As illustrated, filters 112 provide filtration regarding electrical or communicative signals 113, and filter 114 provides filtration and "cleaning" of a power signal 116. In various embodiments, the filters could be, for example, band-pass, low-pass, or common mode filters, or even a surge arrester. Other types of filters could be included as well.

In the embodiment shown, the signal output by the power filter 114 is passed to a power supply 116, which regulates the received, filtered power signal (e.g., a DC or AC signal) and provides a power signal (e.g., a direct current signal at a predetermined voltage desired by the electronics 108).

In the embodiment shown, the enclosure 102 can also contain fiber optic equipment; accordingly, a waveguide beyond cutoff 120 can be included in the barrier 110, and a fiber optic cable 121 could be extended from external to the enclosure, through the unprotected region 106, and into the protected region (e.g., to a fiber converter 122). The waveguide beyond cutoff is configured to allow optical signals of a predetermined frequency to pass from the unprotected portion to the protected portion, while filtering undesirable signals of different frequency or magnitude.

Furthermore, it is recognized that in many circumstances, the electronics 108, 122 within an enclosure may require airflow, for example for cooling purposes. In the embodiment shown, the enclosure 102 includes a plurality of vents 124 through the enclosure 102 and the barrier 110, which allow airflow from external to the enclosure 102 to pass into at least one of the protected region 104 and the unprotected region 106. In the embodiment shown, the vents 124 are positioned in alignment to allow a flow-through, aligned configuration. In alternative embodiments, different positions of vents could be used. Each of the vents 124 are formed of a waveguide beyond cutoff having one or more honeycomb-shaped or otherwise stacked shapes and arranged apertures configured to shield the interior volume of the enclosure 102, including both the protected and unprotected regions 104, 106, from exposure to electromagnetic signals exceeding a predetermined acceptable magnitude and frequency. For example, signals up to 10 GHz and up to 100 kilovolts per meter, can be filtered by correctly selected sizes of waveguide apertures.

In the embodiment shown in FIG. 1, the protected region 104 and unprotected region 106 can be joined at a barrier 110, which is formed by a seal formed between flanges of the enclosure, as discussed in further detail in connection with FIGS. 4-9, below. To ensure no leakage of electromagnetic signals between the portions of the enclosure 102, an RF shielding gasket 128 can be placed between the flanges, and affixed in position by bolts 130 connecting portions of the enclosure 102.

In the alternative embodiment shown in FIG. 2, the enclosure 102 is illustrated as having a portal opening on the side of the protected region 104, such that the protected region 104 can be directly accessed rather than enclosed and only accessible via the unprotected region 106. In such an embodiment, an additional shielding surface 140 can be attached to the enclosure 102, such as a wall of another electronic device, a cover, or other type of connection. Protection of the protected region 104 can be maintained by a second barrier 110 with associated gasket 128 and bolt 130 arrangement.

Figure 3:
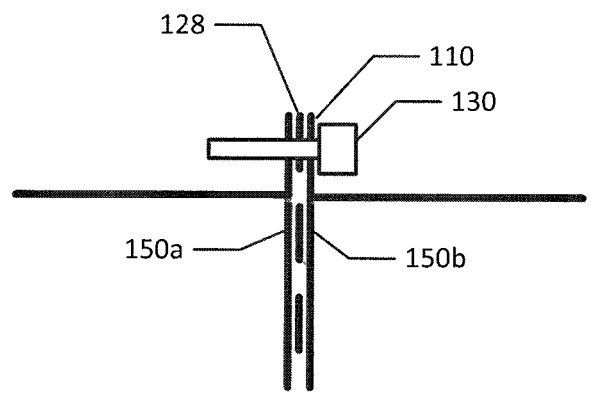
FIG. 3 is a schematic close-up view of a conductive gasket and connection between a protected section and an unprotected section of the arrangement of FIG. 1.
Figure 4:
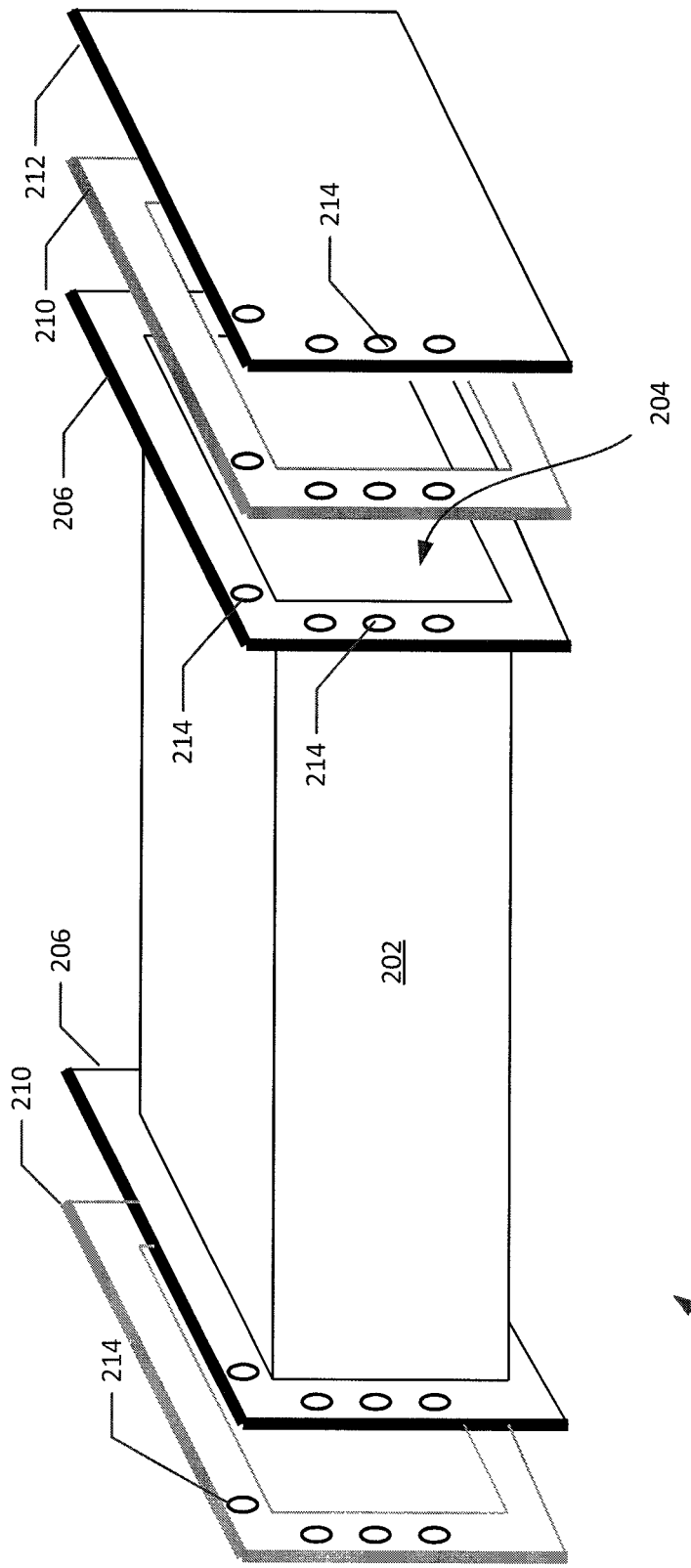
FIG. 4 is a schematic perspective view of a duct-style EMP/IEMI/RF protective enclosure, according to a possible embodiment.
Figure 5:
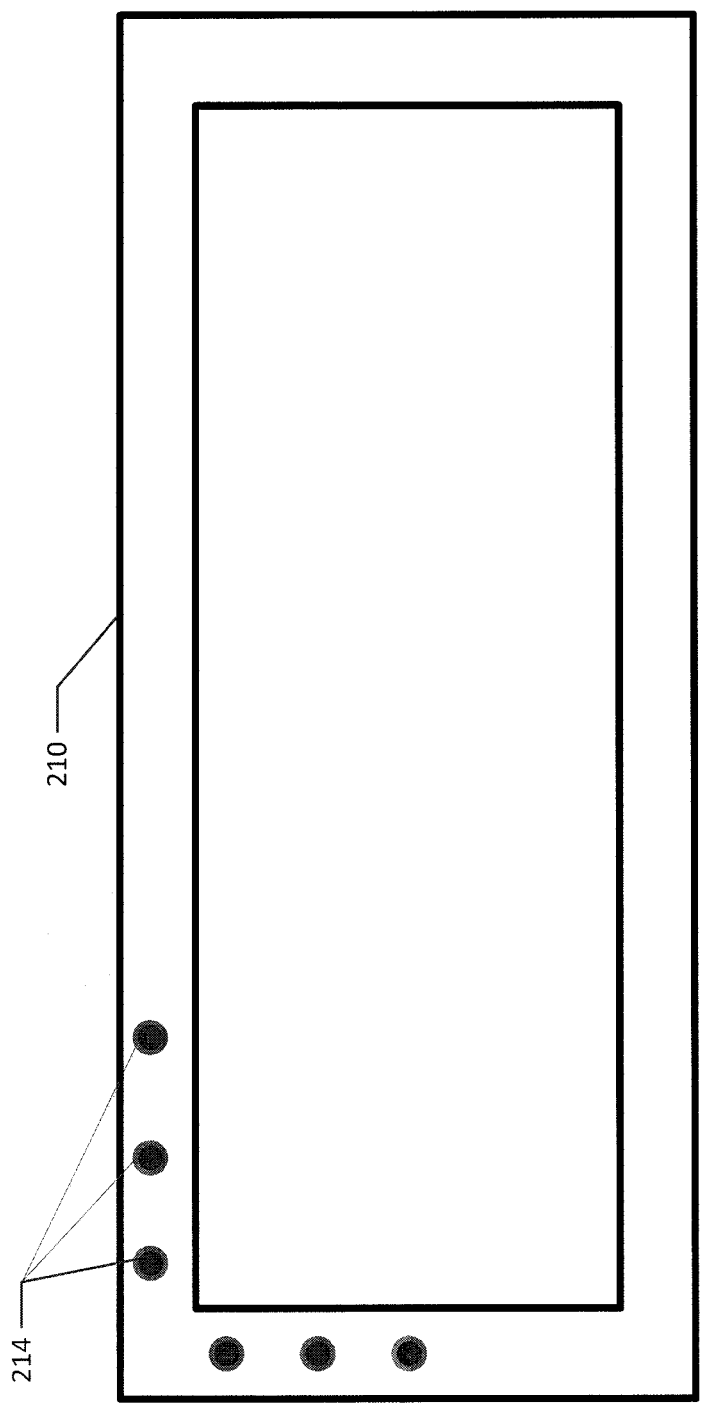
FIG. 5 is a front schematic view of the enclosure of FIG. 4, and shows how the front section connects to the protected section.

Referring now to FIG. 3, additional details regarding the gasket 128 and bolt 130 arrangement are shown. In this illustration, the gasket is trapped between two flanges 150a-b, which can be, in various embodiments, flanges of portions of an enclosure, such as enclosure 102 of FIGS. 1-2. One of flanges 150a-b could alternatively be a portion of a cover or other structure providing shielding, such as the barrier 140 of FIG. 2. In the embodiment shown, the bolt 130 passes through the flanges 150a-b and the gasket 128, thereby ensuring that the gasket maintains contact with both flanges continuously and compresses the gasket material uniformly, thereby preventing leakage at the joinder of the flanges. The bolt 130 can, in some embodiments, be removable to allow access to an interior volume of the enclosure 102.

Referring now to FIGS. 4-9, various views of example configurations of enclosures are illustrated that can be constructed in accordance with the general principles set forth above with respect to FIGS. 1-3. In FIGS. 4-7, a schematic perspective view of a duct-style EMP/IEMI/RF protective enclosure 200 is shown, according to a possible embodiment. In this example embodiment, the enclosure includes a main body 202 with an opening 204 in at least one side providing access to an interior volume of the enclosure. The main body 202 is generally rectangular, and therefore has a number of corner seams. In some embodiments, each of these corner seams of the duct enclosure body 202 will be welded so as to prevent EMP, IEMI or RF energies from penetrating the enclosure.

In the embodiment shown, the enclosure 200 has flanges 206 on opposing sides which, in the embodiment shown, are configured to cooperate with adjacent metallic structures to form a completely closed interior area using the gasketed arrangement discussed above in connection with FIGS. 1-3. In the embodiment shown, a cover 212 is interconnected with body 202 at a first end using a gasket 210, and at an opposing end a gasket 210 can also be joined to the flange 206, to attach another portion of the enclosure (either a further body 202, or an end portion, such as might contain an unprotected region such as region 106 of FIGS. 1-2. Such a duct style enclosure 200 has conductive gaskets 210 on opposing ends, for attaching the cover 212 and an unprotected portion 250 (shown in FIG. 6) containing filters and other associated equipment on the back. The duct style enclosure is designed to slip over a tray of electronics (not shown), such that they are protected.

A plurality of fastener locations 214 are also shown, through which fasteners (e.g., bolts 130) can be affixed, thereby compressing gaskets 210 between associated flanges 206. Although in the embodiment shown the fastener locations 214 are positioned in one corner of the flange 206 and associated gasket 210, it is understood that in many embodiments, the fastener locations are distributed around a perimeter of the gasket and flange. Additionally, although in some embodiments a bolt fastener can be used; other fasteners could be used as well.

Figure 6:
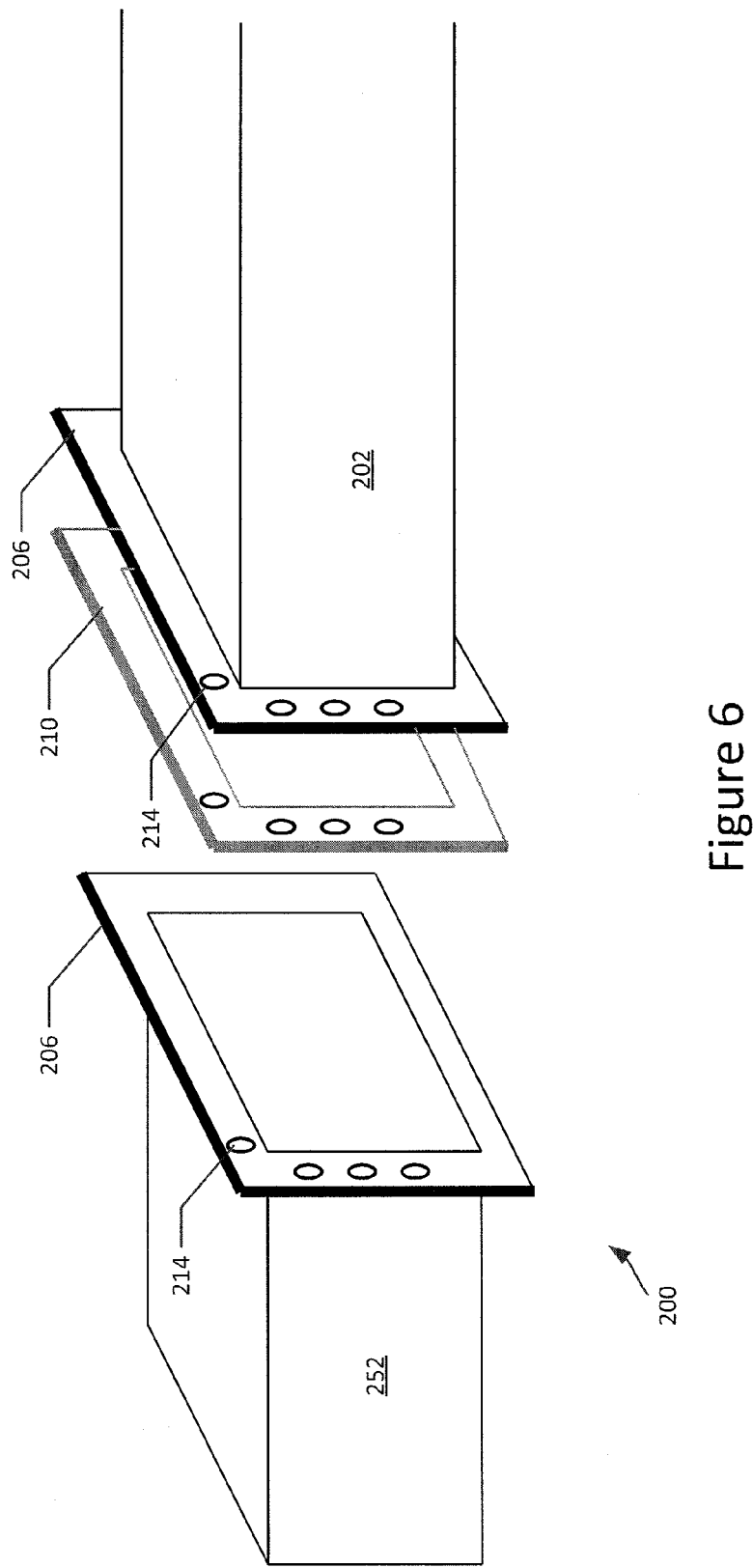
FIG. 6 is a perspective view of the enclosure of FIG. 4, illustrating how a back filter section connects to the protected section.
Figure 7:
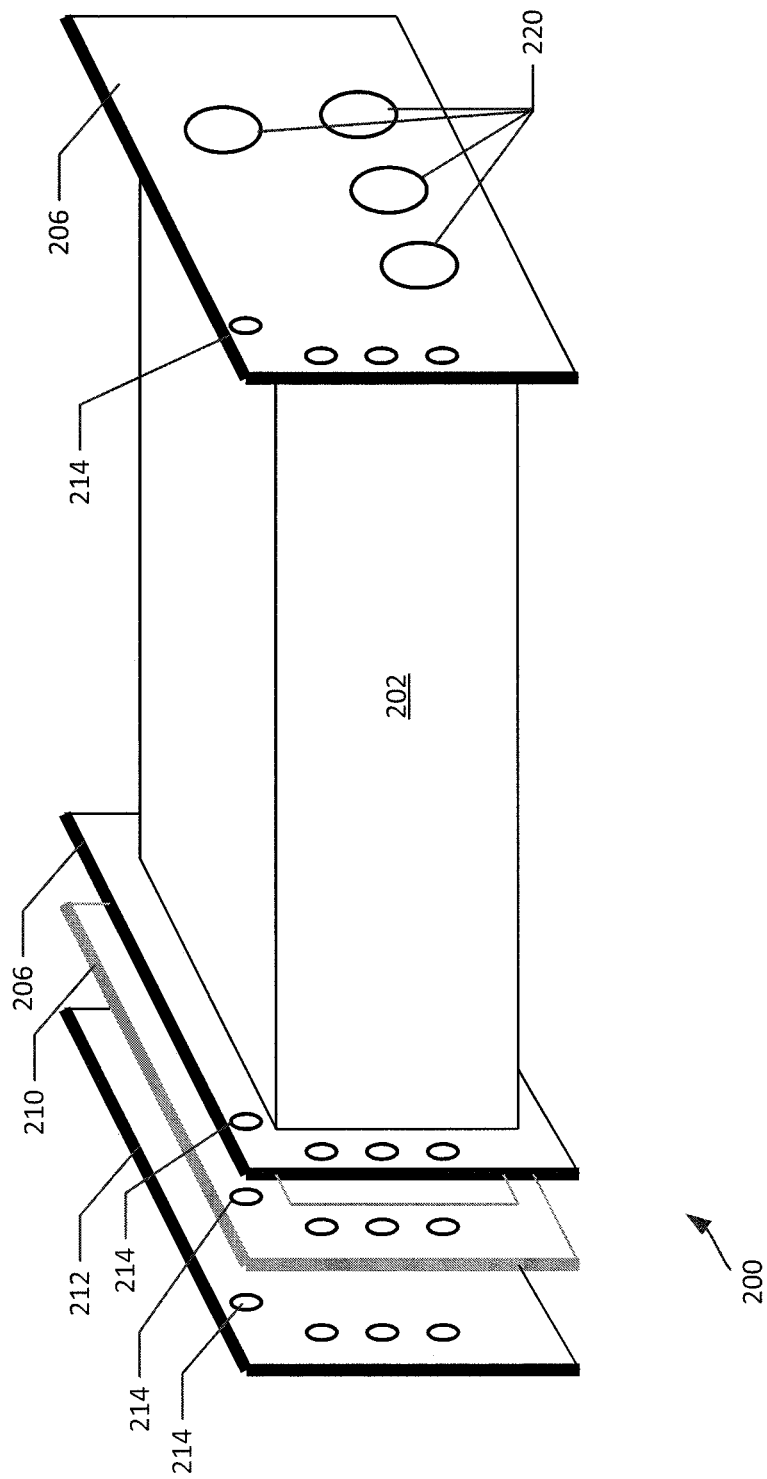
FIG. 7 is a rear perspective view of the enclosure of FIG. 4, illustrating an example configuration for connecting between a protected section and an unprotected section of the enclosure.
Figure 8:
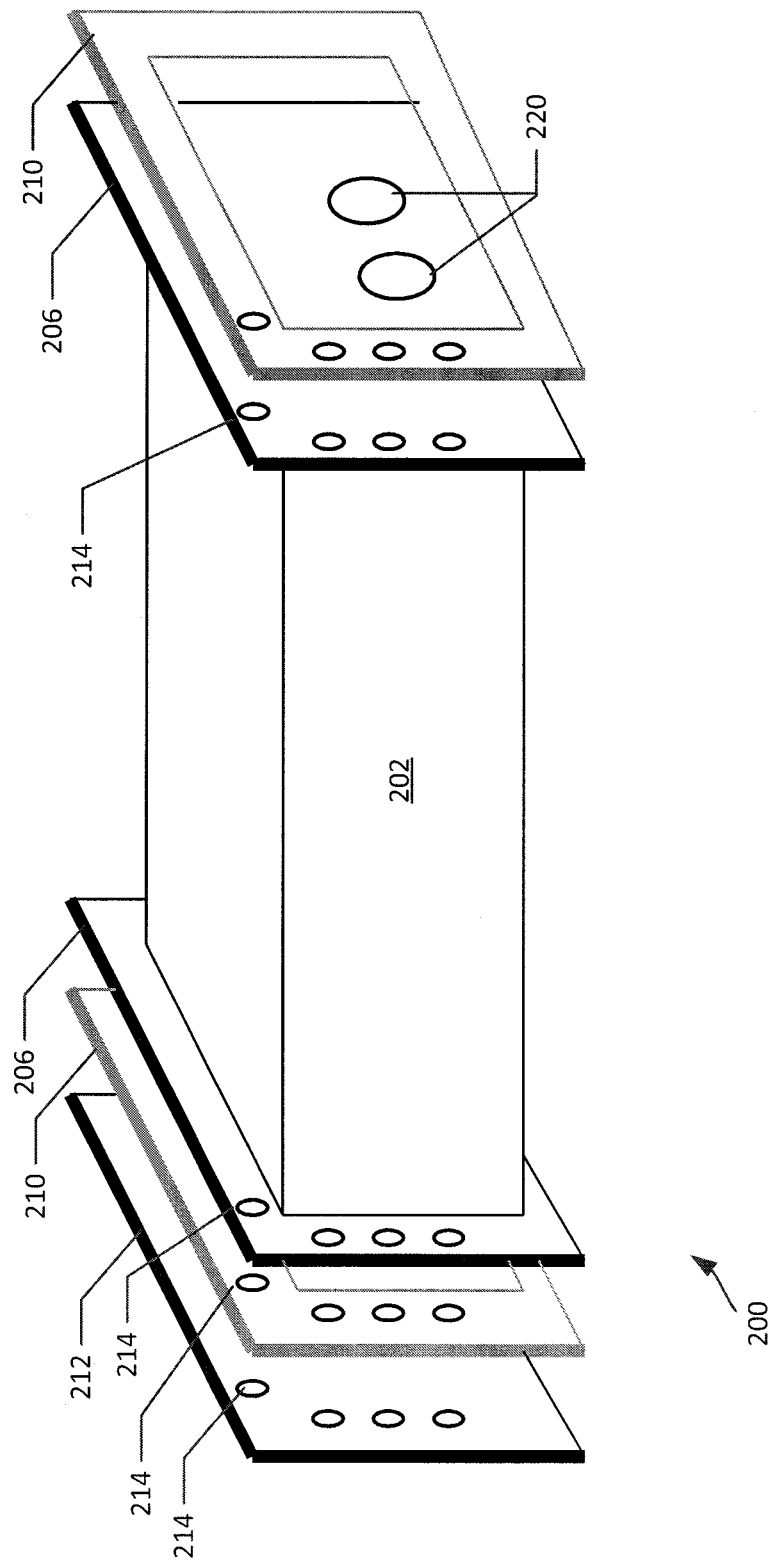
FIG. 8 shows the conductive gasket of FIG. 7, which connects the protected section to the filter section.

As particularly illustrated in FIG. 6, the unprotected portion 250 has a complementary flange 206 and connects to the body 202 at a gasketed junction. As seen in the rear perspective view of FIGS. 7-8, openings 252 are located in the end to which the unprotected portion 250 is connected. The openings are positioned to receive conduits leading from filters, waveguides beyond cutoff, and associated vents, as illustrated in the schematic view of FIG. 1. As seen in FIG. 8, a gasket 210 located between the body 202 and unprotected portion 252 surrounds the openings 252.

Figure 9:
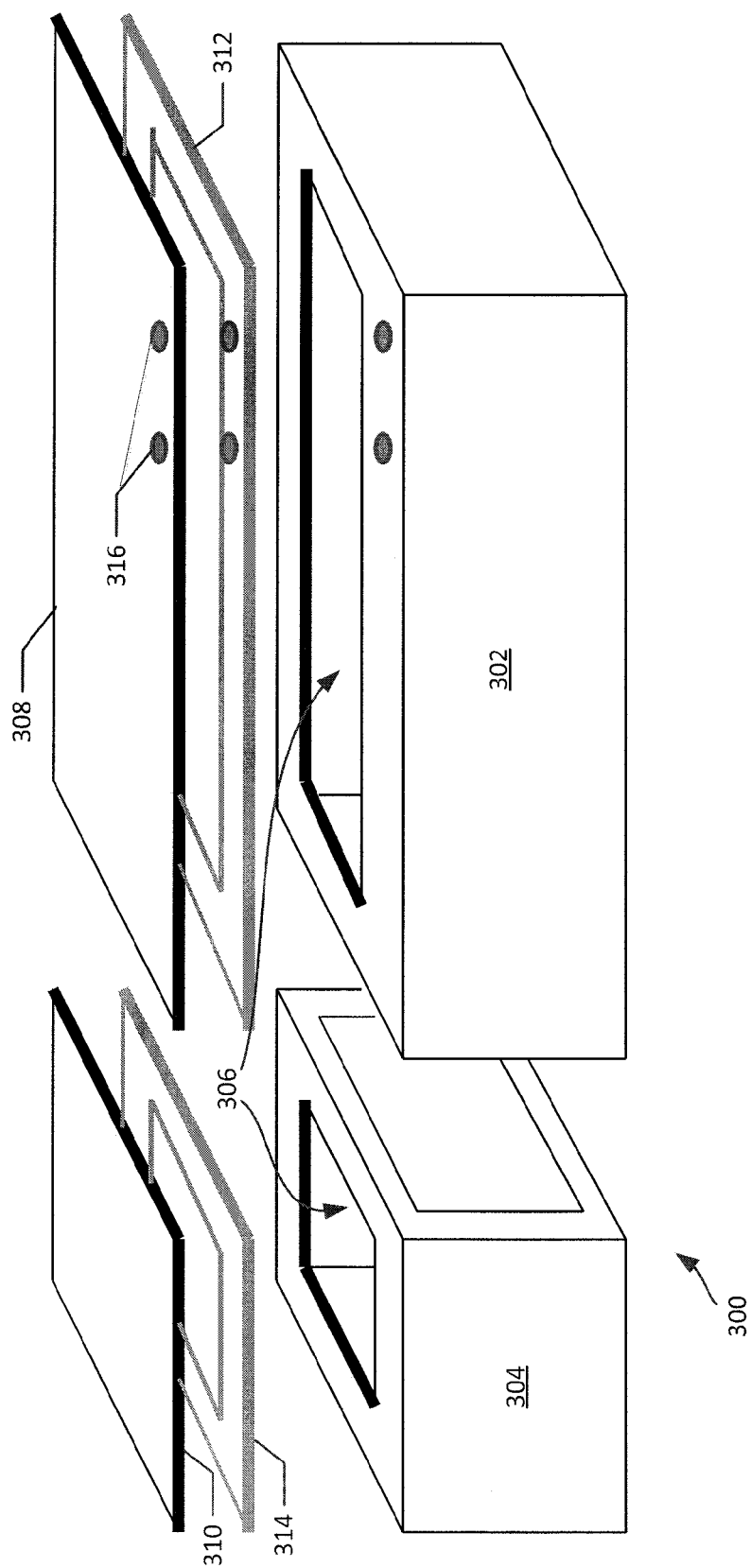
FIG. 9 shows a schematic perspective view of a second embodiment of a "shoebox style" electromagnetically shielding enclosure.

Referring now to FIG. 9, a front perspective view of a shoe box style EMP protective enclosure 300 is shown. The enclosure 300 generally can be constructed using principles discussed above with respect to FIGS. 1-8, including use of welded seams. The enclosure 300 includes a detachable protected portion 302 and unprotected portion 304, which can be joined at a barrier area as discussed above. In the embodiment shown, a portal opening 306 is positioned generally along a top of each portion of the enclosure 300 (rather than at opposed ends, as shown in FIGS. 4-7). Covers 308, 310 are positioned over each portion 302, 304, respectively, and are attached using an associated gasket 312, 314, and fasteners (not shown) such as bolts or other fastening devices as previously described, at fastening locations 316.

In addition to the embodiments discussed above, it is recognized that further alternative enclosures could be provided for use with electronic equipment, in which different organizations of portal openings or unprotected and protected enclosure regions could be used. Additionally, although generally rectangular shaped housings are shown in FIGS. 4-9, other sizes and shapes of enclosures could alternately be used.

Referring now to FIGS. 10-16, various possible applications of the enclosures and shielding arrangements of FIGS. 1-9 are shown. In the various embodiments discussed below, various types of equipment and systems for protecting utility, SCADA, and communications electronics against damage or upsets from electromagnetic pulse (HEMP or EMP), intentional electromagnetic interference (IEMI), and high power RF weapons are disclosed.

Referring first to FIGS. 10-13, features of an electromagnetically shielded supervisory control and data acquisition (SCADA) system 400 are disclosed.

Generally, a SCADA system includes numerous sensors and/or transducers for capturing data, as well as SCADA control electronics for acquiring and supervising information acquisition from those sensors and transducers. In the embodiment shown, a SCADA control electronics module 402 is positioned within a first shielded enclosure, according to the principles illustrated above in connection with FIGS. 1-9. Additionally, shielded sensor/transducer modules 404a-d are remote from the SCADA module 402. Wired connections 406a-d between the SCADA module 402 and the sensor/transducer modules 404a-d, respectively, are in some embodiments shielded, wired connections, or alternatively fiber-optic connections.

Figure 10:
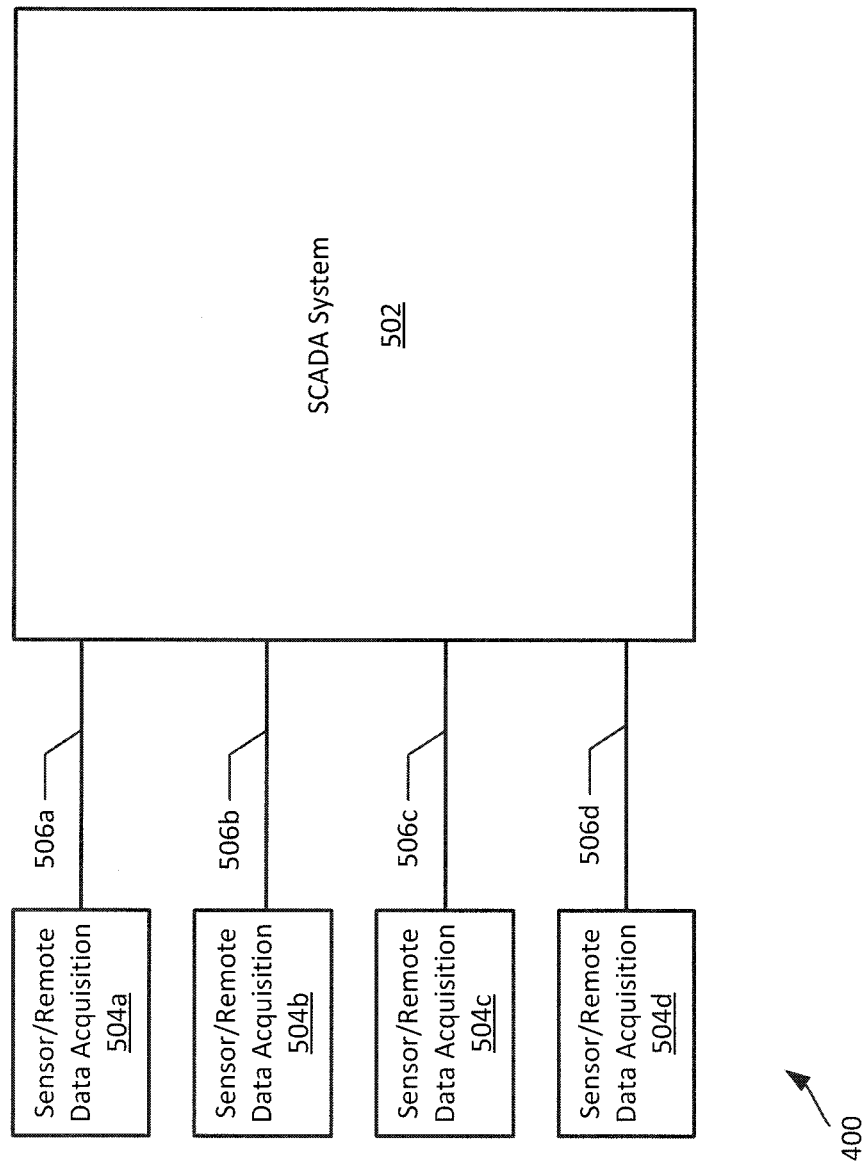
FIG. 10 illustrates an example embodiment of an EMP/IEMI/RF protected SCADA system comprised of sensors, transducers and other input/output devices along with protected SCADA control system electronics.
Figure 11:
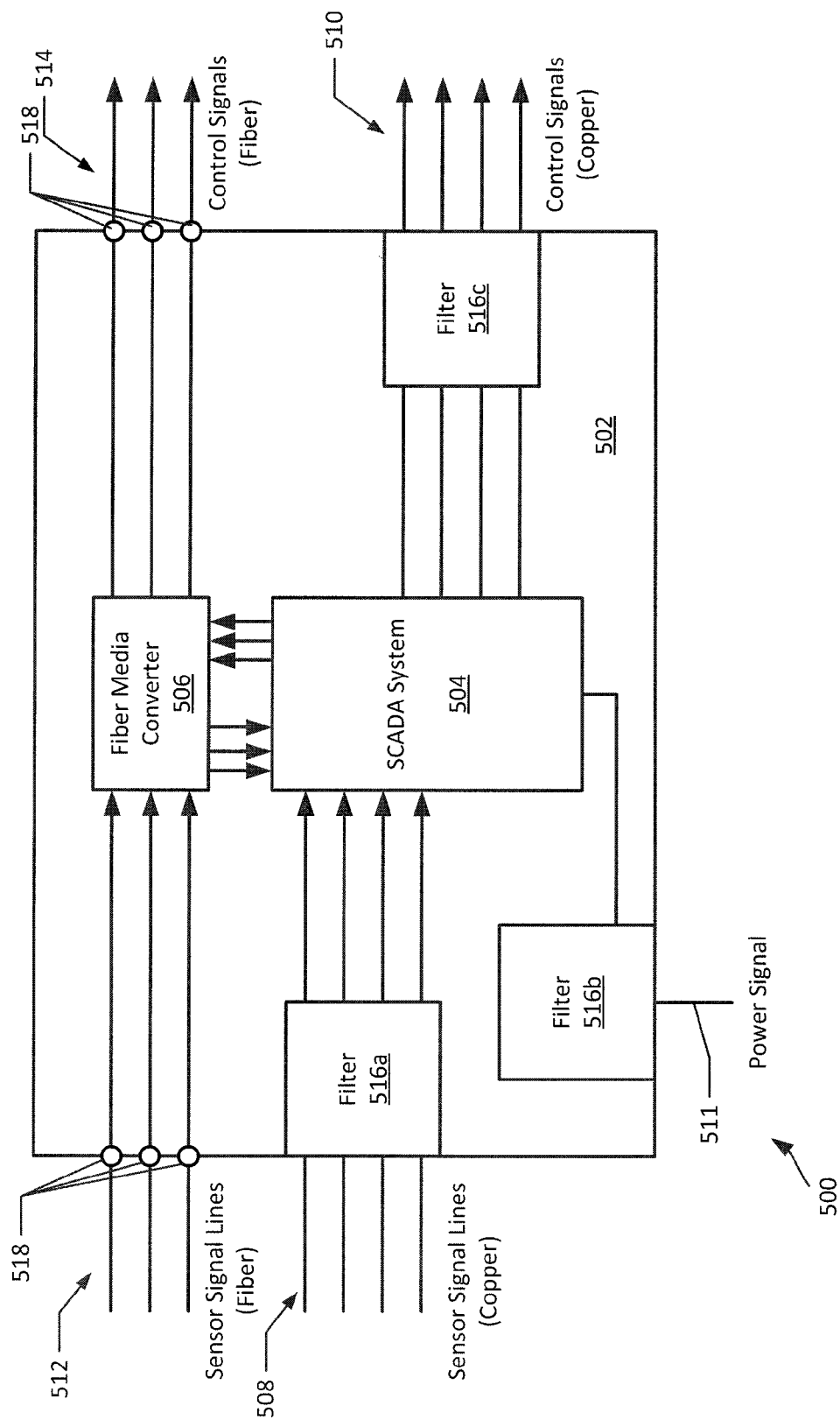
FIG. 11 is a schematic block diagram of a protected supervisory control and data acquisition (SCADA) system, according to a possible embodiment.

Referring now to FIG. 11, a schematic block diagram of a protected SCADA system 500 is shown. The protected SCADA system 500 represents an example embodiment of the shielded SCADA system 402 of FIG. 10, above.

In this embodiment, a shielded enclosure 502 houses a SCADA system 504, which is configured to electrically communicate with a fiber media converter 506. The shielded enclosure 502 can be any of a number of types of shielded enclosures. Typically, the shielded enclosure 502 is a metallic enclosure, such as steel or aluminum enclosure, as previously disclosed. The shielding attenuation effectiveness of the enclosure 502 is typically greater than 70 db; however, other attenuation amounts are possible.

The SCADA system 504 receives a number of input sensor signals from sensor signal lines 508, typically on electrical communication lines. The SCADA system 504 outputs control signals on electrical signal lines 510 as well. The SCADA system 504 receives power from a power source 511, shown as a 120 volt power supply line. Additionally, the fiber media converter 506 receives sensor signals from input fiber optic cables 512, and transmits control signals on output fiber optic cables 514.

In the embodiment shown, a plurality of signal filters 516a-c are placed on each of the electrical lines as they enter the enclosure 502. The term signal filter is intended to include any type filter that allows the passage of the desired signal but blocks unwanted signals. As such the term signal filter shall include, but is not limited to, low pass filters, band-pass filters, Ethernet filters, common mode rejection filters all of which include surge arrestor protection. In the embodiment shown, the sensor signal lines 508, which carry electrical input signals from the various input sensors, are filtered using a signal filter with a surge arrestor 516a, which can be, in certain embodiments, one or more EMP signal filters with surge arrestors. The electrical signal lines 510, which control the various actuators, are also filtered with a signal filter 516b, which can be an EMP signal filter. The power line 511 to the SCADA system 504 is also brought into the enclosure through a signal filter 516c, such as an EMP signal filter. The three filters 516a-c typically have an attenuation rating of greater than about 70 db.

The input fiber optic cables 512 and output fiber optic cables 514 enter the enclosure through waveguides 518, which is implemented as a waveguide beyond cutoff a specific frequency. The input fiber optic cables 512 can be, for example, high bandwidth sensor and transducer signals received from other protected modules, as discussed below. The output fiber signal lines 514 can be, for example passed out of the enclosure 502 to actuators or other systems. Thus the shielded enclosure and the waveguides prevent radiated electromagnetic energy from entering the enclosure and the signal filters prevent conducted electromagnetic energy from entering the enclosure 502.

In certain embodiments, the filters 516a-c and waveguides 518 can be located in an unprotected portion of an enclosure, with the SCADA system 504 and associated fiber media converter 506 located in a protected portion of the enclosure, as generally discussed above in connection with FIG. 10. Other arrangements are possible as well.

Figure 12:
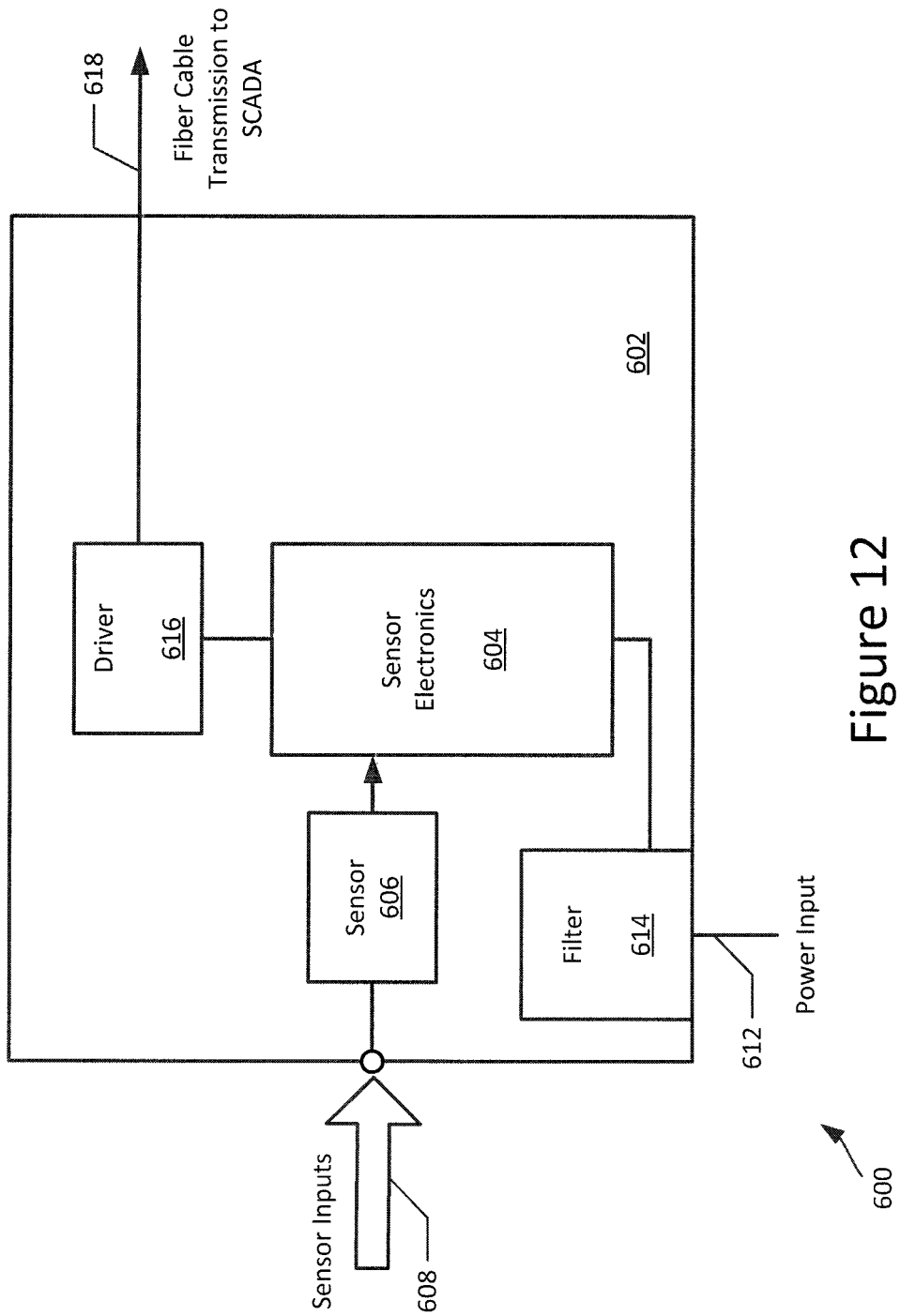
FIG. 12 is a schematic block diagram of a sensor protection portion of a protected supervisory control and data acquisition (SCADA) system, according to a possible embodiment.

FIG. 12 is a schematic block diagram of additional details of a sensor protection portion 600 of a protected supervisory control and data acquisition system. The sensor protection portion 600 can be an example embodiment of a sensor/transducer module 404, as discussed above in connection with FIG. 10, in particular embodiments in which the sensor/transducer module is a sensor module having a fiber-optic data interface to the SCADA control system.

In the embodiment shown, the sensor protection portion 600 includes a, EMP/IEMI/RF shielded enclosure 602, which can for example correspond to or be a portion of the shielded enclosure 502 of FIG. 10. In other embodiments (such as that shown), the shielded enclosure 602 can be a separate enclosure interfaced to the shielded enclosure 502 by way of fiber optic signal transmission, as further discussed below.

One or more sensors 604 are included within the container 602, and are interfaced to sensor electronics 606, which are used to process and monitor readings received from the sensors 604. Various types of sensors can be used. In certain embodiments, the sensor 604 can be a temperature sensor, a pressure sensor, a flow sensor, a level sensor, a vibration sensor, a humidity sensor, a magnetic field sensor, a gas sensor of various types (e.g., oxygen, carbon monoxide, carbon dioxide, or various types of air particulate sensors), or an acoustic sensor. Other types of sensors can be included as well.

A sensor input 608 can be received into the shielded enclosure 602 via a pipe 610, which has an internal waveguide beyond cutoff integrated thereon. The waveguide beyond cut off prevents electromagnetic (RF) radiated energy from entering the enclosure. A power line 612 providing electrical power to the sensor electronics 606 can be received into the shielded enclosure 602, and can include a low-pass filter 614 at a boundary of the shielded enclosure, which can be, for example, a signal EMP filter which allows passage of frequencies below about 14 kHz but also provides surge arrestor protection.

From the sensor electronics 606, a driver 616 can receive a signal and retransmit the signal on a fiber optic cable 618, which can extend through the shielded enclosure 602 and lead to a central SCADA monitoring system, such as the system 402 of FIG. 10, or system 504 of FIG. 11. In alternative embodiments, the sensor electronics 606 can transmit data to the central SCADA monitoring system via an electrical cable (assuming a sufficiently low frequency data communications protocol useable between systems such that the transmitted data would not be filtered by low-pass filters integrated into enclosures 502, 602). In such embodiments, a further low-pass filter could be used to filter that electrical cable as it exits the enclosure 602.

Figure 13:
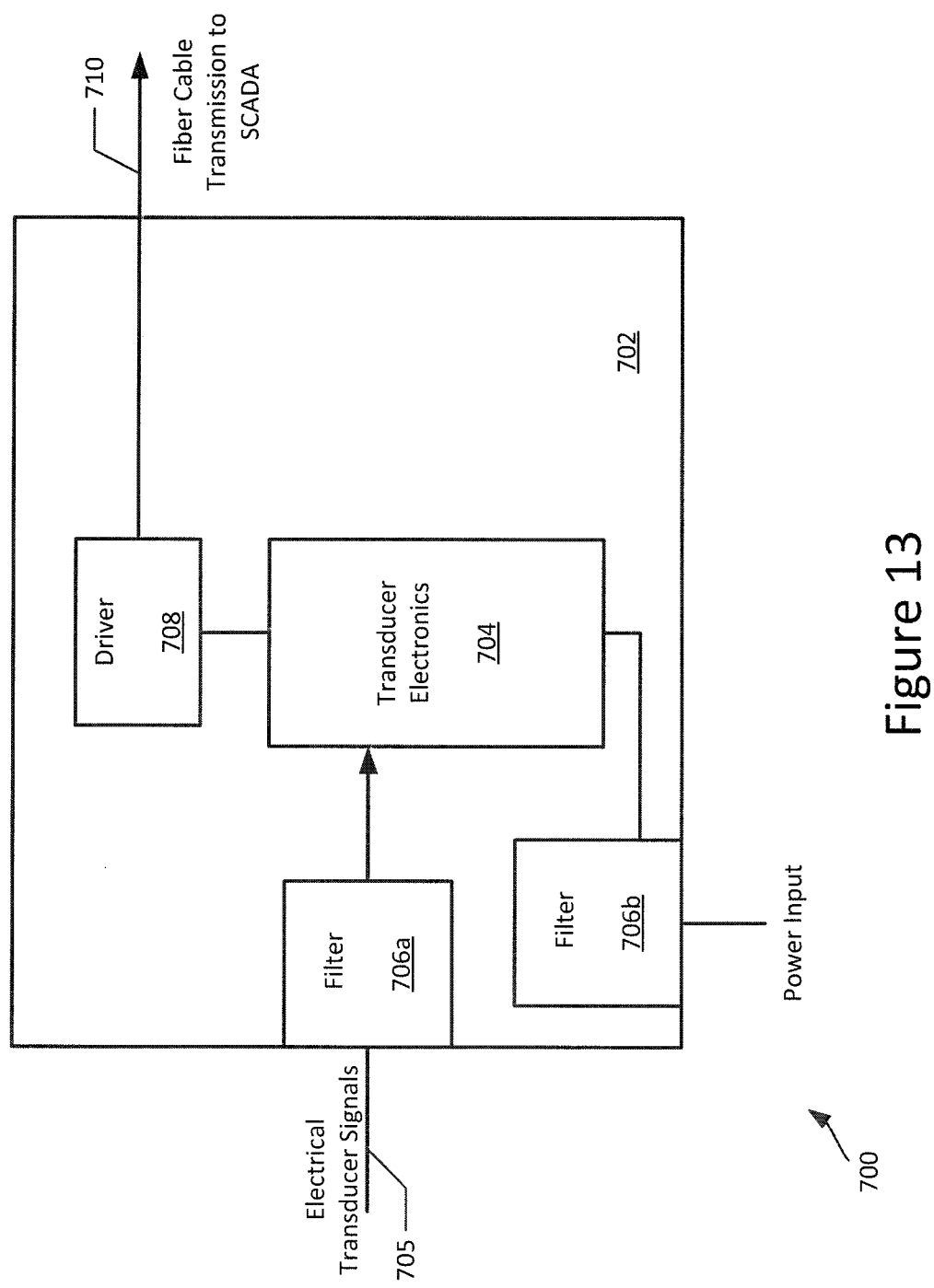
FIG. 13 is a schematic block diagram of additional details of an electrical signal protection portion of a protected supervisory control and data acquisition (SCADA) system, according to a possible embodiment.

FIG. 13 is a schematic block diagram of additional details of an electrical signal protection portion 700 of a protected supervisory control and data acquisition system. The electrical signal protection portion 700 can be an example embodiment of a sensor/transducer module 404, as discussed above in connection with FIG. 10, in particular embodiments in which the sensor/transducer module is a transducer module having a fiber-optic data interface to the SCADA control system.

In the embodiment shown, the electrical signal protection portion 700 includes a shielded enclosure 702, which can shield internal components from EMP/IEMI/RF events, similarly to enclosures 502, 602 of FIGS. 11-12. The electrical signal protection portion 700 includes a transducer 704. The transducer 704 receives signals 705 from external to the enclosure 702, which are passed through a low-pass filter 706a, as well as electrical power received through a further low-pass filter 706b. As explained above, the signal filters 706a-b can be, for example, an EMP filter which attenuates EM frequencies above 14 kHz and includes surge suppression as well. From the transducer 704, a driver 708 can receive a signal and retransmit the signal on a fiber optic cable 710, which can extend through the shielded enclosure 702 and lead to a central SCADA monitoring system, such as the system 504 of FIG. 11. In alternative embodiments, the transducer 704 can transmit data to the central SCADA monitoring system via an electrical cable, (assuming a sufficiently low frequency data communications protocol useable between systems such that the transmitted data would not be filtered by low-pass filters integrated into enclosures 502, 702).

Figure 14:
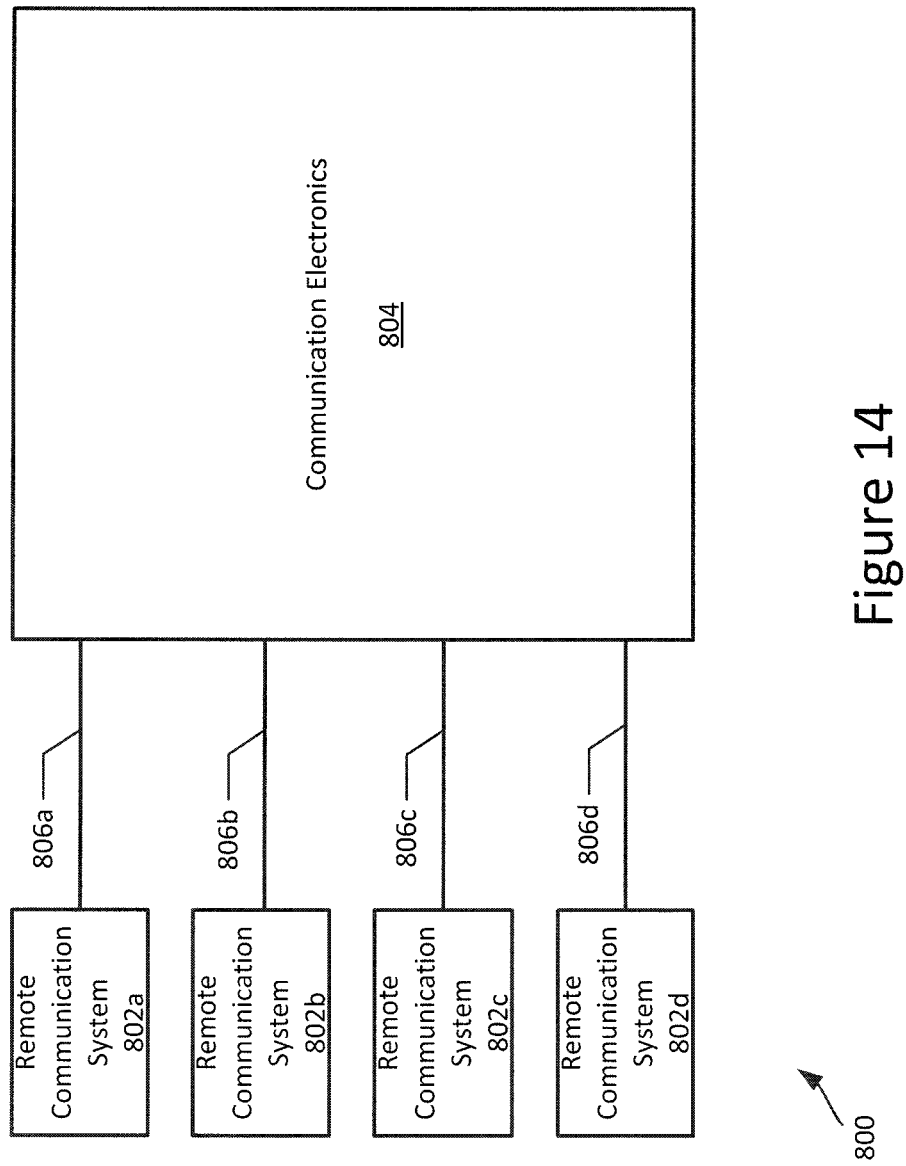
FIG. 14 illustrates an example embodiment of an EMP/IEMI/RF protected communications system comprised of communications transmit and receive devices as well the communications switching and routing electronics.
Figure 15:
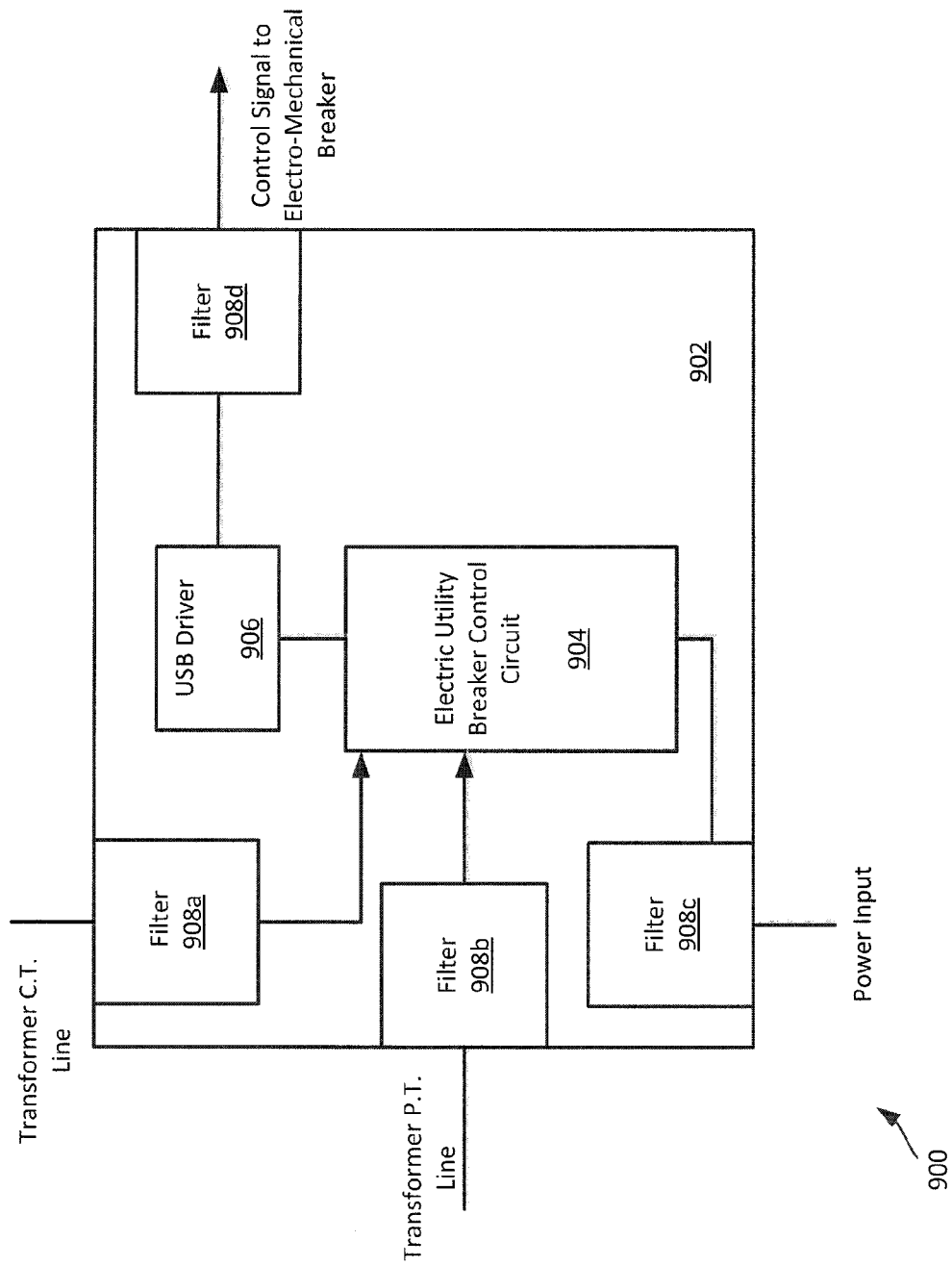
FIG. 15 is a schematic block diagram of electrical utility breaker control electronics, according to a possible embodiment.
Figure 16:
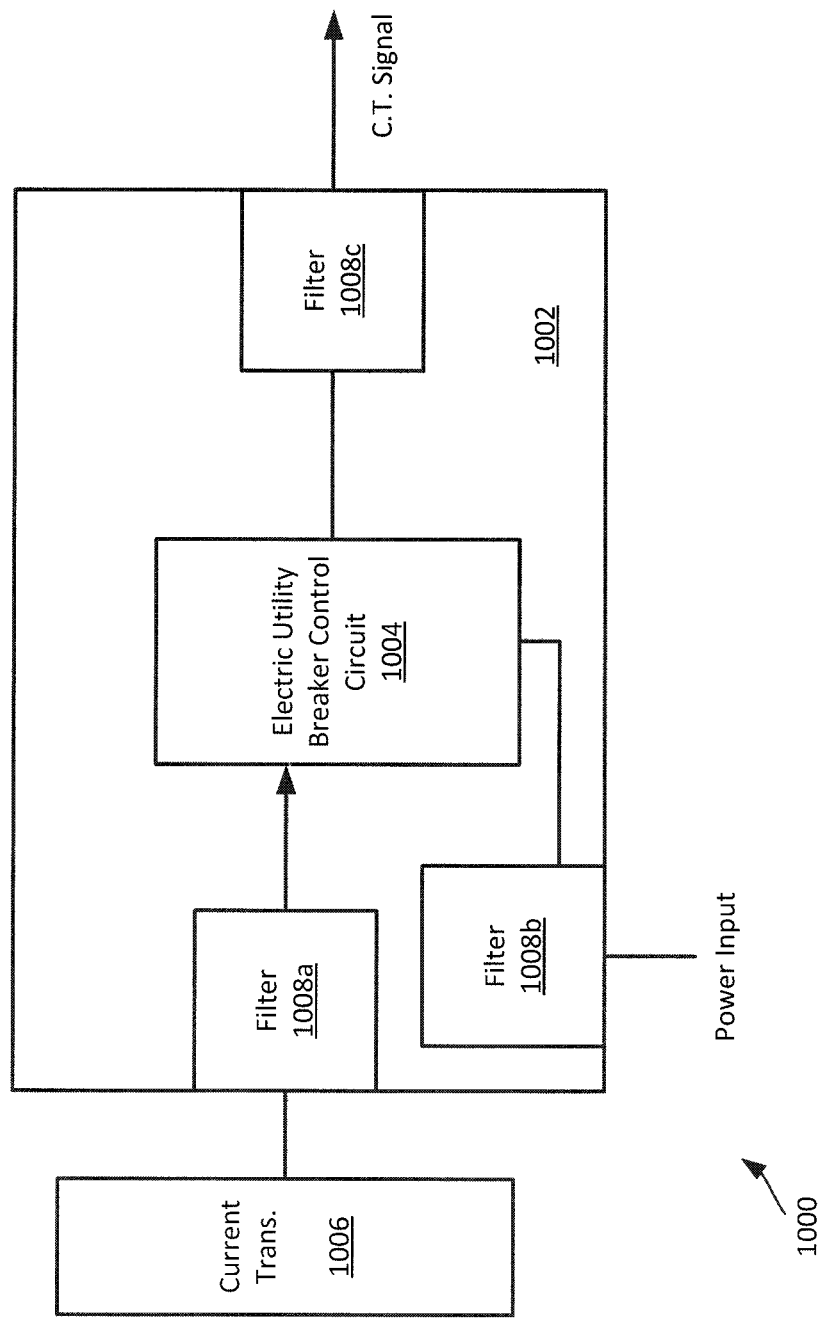
FIG. 16 is a schematic block diagram of a protection arrangement for an electric utility transducer, according to a possible embodiment.

Referring now to FIGS. 14-16, various alternative types of electronic systems are disclosed beyond SCADA systems which implement the shielding principles discussed herein. FIG. 14 is a schematic drawing of an EMP/IEMI/RF protected communications system 800. The protected communications system 800 includes a number of communications devices 802a-d along with the communications switching and routing system electronics 804. Each of the communications devices will be housed within an EMP/IEMI/RF protected enclosure, according to the principles and using the structures described herein. Additionally, the communications switching and routing electronics 804 will also be housed within an EMP/IEMI/RF protected enclosure. Connections 506*a-d* between the communications devices 502*a-d* and the switching and routing electronics 504 are, in some embodiments, shielded, wired electrical communicative connections. However, other types of connections could be used as well.

In a further example of an application for shielded electronics, FIG. 15 shows an example block diagram of electrical utility breaker control electronics 900. The electrical utility breaker control electronics 900 are shown as housed in a shielded enclosure 902, which can be any of a number of types of shielded enclosures. Typically, the shielded enclosure 902 is a metallic enclosure, such as steel or aluminum enclosure.

Within the enclosure 902, an electrical utility breaker control circuit 904 is electrically connected to a serial cable. The electrical utility breaker control circuit 904 has a number of inputs, including input signals from two transformer lines and a power signal. Each of the input lines has associated with it a low-pass filter 908. In the embodiment shown a first signal filter 908*a* is placed at a boundary of the shielded enclosure 902 to filter the current transformer (CT) signal, a second signal filter 908*b* is placed at a boundary of the shielded enclosure 902 to filter the potential transformer line, and a third signal filter 908*c* is placed at a boundary of the shielded enclosure 902 to filter the input power to the enclosure. Each of the signal filters 908*a-c* are connected to the electrical utility breaker control circuit 904. Additionally, a fourth signal filter 908*d* is connected along an output control signal from the USB driver 906, and is placed at a boundary of the shielded enclosure 902. This filter 908*d* is used to filter out any unwanted conductive EMP/IEMI/RF signals from outside sources. The output control signal from the USB driver is configured to control an electro-mechanical circuit breaker.

In certain embodiments, the shielding provided by the shielded enclosure 902 is larger than 70 dB. Likewise the four signal filters 908*a-d* should typically have an attenuation rating of larger than about 70 dB. In the embodiment shown, all four power filters 908*a-d* are housed within one container within the enclosure; in alternative embodiments, multiple shielded containers can be used.

Since electronics are located with or in the area of the CT Transformer, it can also in certain embodiments be housed in the shielded enclosure 902, or some other type of EMP, IEMI or RF protective enclosure with power filters on the input, the output and the power source. Referring now to FIG. 16, a schematic block diagram of a protection arrangement 1000 for an electric utility transducer is shown. The protection arrangement 1000 includes a shielded enclosure 1002 containing an electric utility transducer 1004, which can be any of a number of types of shielded enclosures as previously described. In the embodiment shown, the electric utility transducer 1004 receives an input signal from a current transformer 1006, and outputs a current transformer signal. A first signal filter 1008*a* is connected between the current transformer 1006 and the electric utility transducer 1004, and a second signal filter 1008*b* is connected between a power source (e.g., a 120 V power input signal) and the electric utility transducer 1004. Additionally, a third signal filter 1008*c* is connected along the output current transformer signal. As explained above, each of these filters 1008*a-c* are placed at a boundary of the shielded enclosure 1002 (or a boundary between an unprotected portion and a protected portion thereof), to prevent spurious and potentially damaging EMP/IEMI/RF conductive signals from entry into an interior of the enclosure, potentially damaging the circuitry included within.

Referring back to FIGS. 1-16 generally, it can be seen that the shielding principles discussed herein can be applied across a variety of types of electronic devices, and in particular electronics used for management of power systems or other infrastructure, where costs of damage or data failure could be severe. Accordingly, applying the cost-effective solutions described herein can help mitigate substantial risks of damage due to particular types of electromagnetic events, such as EMP/IEMI/RF events. Additionally, using the enclosures and systems disclosed in FIGS. 1-16, it is possible to allow electronic systems to continue operation during such EMP/IEMI/RF events, rather than shutting down or otherwise halting operation. Accordingly, uptime and reliability are improved.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A shielding arrangement for an electronic device, the shielding arrangement comprising:
   a metallic enclosure having an interior volume, the interior volume defining a protected portion and an unprotected portion separated by an electromagnetically shielding barrier, the metallic enclosure having a portal providing access to at least the protective portion, the portal including an access opening, a shielding cover sized to cover the access opening, and an electromagnetically sealing gasket positioned around a perimeter of the access opening;
   an electrical filter positioned at least partially within the unprotected portion and along the electromagnetically shielding barrier, the electrical filter configured to dampen and diminish electromagnetic signals outside a predetermined acceptable range;
   a power filter positioned at least partially within the unprotected portion and along the electromagnetically shielding barrier, the power filter configured to receive an unfiltered power signal from external to the metallic enclosure and pass a filtered power signal through the electromagnetically shielding barrier to the protected portion;
   a waveguide beyond cutoff positioned along the barrier and configured to allow optical signals of a predetermined frequency pass from the unprotected portion to the protected portion; and
   one or more vents through the metallic enclosure and allowing airflow from external to the enclosure to pass into at least one of the protected portion and the unprotected portion, the vents each formed of a waveguide beyond cutoff having one or more apertures configured to shield the interior volume from exposure to electromagnetic signals exceeding a predetermined acceptable magnitude and frequency.

2. The shielding arrangement of claim 1, wherein the metallic enclosure is generally rectangular and has a front, rear, top, bottom, left and right sides, and wherein the portal is positioned on at least one of the front, rear, top, bottom, left or right sides.

3. The shielding arrangement of claim 2, further comprising a bolt fastening arrangement attaching the cover and electromagnetically sealing gasket over the access opening.

4. The shielding arrangement of claim 1, further comprising a fan positioned in alignment with at least one of the one or more vents, the fan encouraging airflow through at least a portion of the interior volume.

5. The shielding arrangement of claim 1, further comprising an Ethernet signal filter positioned within the unprotected portion and along the barrier, the Ethernet signal filter filtering signals received on Ethernet lines external to the enclosure that exceed a predetermined magnitude or frequency.

6. The shielding arrangement of claim 1, wherein the electrical filter is a filter selected from the group consisting of:
 a low-pass filter;
 a band-pass filter;
 a common mode filter; and
 a surge arrester.

7. The shielding arrangement of claim 1, wherein the enclosure forms a portion of a duct, and wherein the enclosure is inter-connectable to neighboring ducts at gasketed ends.

8. The shielding arrangement of claim 1, wherein the enclosure is constructed from steel and capable of attenuating electromagnetic signals in excess of about 70 dB.

9. The shielding arrangement of claim 1, wherein at least one of the one or more of the vents is positioned along the barrier.

10. An electromagnetically shielded electronic device comprising:
 a metallic enclosure having an interior volume, the interior volume defining a protected portion and an unprotected portion separated by an electromagnetically shielding barrier, the metallic enclosure having a portal providing access to at least the protective portion, the portal including an access opening, a shielding cover sized to cover the access opening, and an electromagnetically sealing gasket positioned around a perimeter of the access opening;
 an electronic device placed within the protected portion of the interior volume;
 an electrical filter positioned at least partially within the unprotected portion and along the electromagnetically shielding barrier, the electrical filter communicatively connected along a wired connection to the electronic device and configured to dampen electromagnetic signals outside a predetermined acceptable range that pass from the unprotected portion to the electronic device along the wired connection;
 a power filter positioned at least partially within the unprotected portion and along the electromagnetically shielding barrier, the power filter configured to receive an unfiltered power signal from external to the metallic enclosure and pass a filtered power signal through the electromagnetically shielding barrier to the electronic device; and
 one or more vents through the metallic enclosure and allowing airflow from external to the enclosure to pass into at least one of the protected portion and the unprotected portion, the vents each formed of a waveguide beyond cutoff having one or more apertures configured to shield the interior volume from exposure to electromagnetic signals exceeding a predetermined magnitude and frequency.

11. The electromagnetically shielded electronic device of claim 10, wherein the electronic device comprises a plurality of electronic devices.

12. The electromagnetically shielded electronic device of claim 11, wherein the electronic device is selected from a group of electronic devices consisting of:
 a supervisory control and data acquisition (SCADA) system;
 an electrical utility circuit breaker; and
 a telecommunications device.

13. An electromagnetically shielded electronic system comprising:
 an electromagnetically shielded electronic device comprising:
  a metallic enclosure having an interior volume, the interior volume defining a protected portion and an unprotected portion separated by an electromagnetically shielding barrier, the metallic enclosure having a portal providing access to at least the protective portion, the portal including an access opening, a shielding cover sized to cover the access opening, and an electromagnetically sealing gasket positioned around a perimeter of the access opening;
  an electronic device placed within the protected portion of the interior volume; and
  an electrical filter positioned at least partially within the unprotected portion and along the electromagnetically shielding barrier, the electrical filter communicatively connected along a wired connection between the electronic device and an external electrical connection, the electrical filter configured to dampen electromagnetic signals outside a predetermined acceptable range that pass from the unprotected portion to the electronic device along the wired connection;
 a second electromagnetically shielded electronic device comprising:
  a second metallic enclosure having an interior volume;
  a second electronic device placed within the interior volume; and
  a second electrical filter positioned at least partially within the second metallic enclosure and communicatively connected along a wired connection between the second electronic device and an external electrical connection, the second electrical filter configured to dampen electromagnetic signals outside a predetermined acceptable range that pass from external to the second metallic enclosure to the second electronic device along the wired connection; and
 a communicative connection between the electronic device and the second electronic device.

14. The electromagnetically shielded electronic system of claim 13, wherein the electronic device includes a supervisory control and data acquisition (SCADA) system, and wherein the second electronic device comprises a sensor device.

15. The electromagnetically shielded electronic system of claim 13, wherein the electronic device includes a communication device, and wherein the second electronic device comprises a remote communication device.

16. The electromagnetically shielded electronic system of claim 13, wherein the communicative connection includes a shielded wired connection between the electronic device and the second electronic device.

17. The electromagnetically shielded electronic system of claim 13, wherein the electromagnetically shielded electronic device further includes one or more vents through the metallic enclosure and allowing airflow from external to the enclosure to pass into at least one of the protected portion and the unprotected portion, the vents each formed of a waveguide beyond cutoff having one or more apertures configured to shield the interior volume from exposure to electromagnetic signals exceeding a predetermined magnitude and frequency.

18. The electromagnetically shielded electronic system of claim 13, further comprising a bolt fastening arrangement attaching the cover and electromagnetically sealing gasket over the access opening.

19. The electromagnetically shielded electronic system of claim 13, wherein the electrical filter is a filter selected from the group consisting of:
   a low-pass filter;
   a band-pass filter;
   a common mode filter; and
   a surge arrester.

* * * * *